(12) United States Patent
Nosaka

(10) Patent No.: US 10,530,335 B2
(45) Date of Patent: Jan. 7, 2020

(54) ACOUSTIC WAVE FILTER DEVICE, RADIO-FREQUENCY FRONT-END CIRCUIT, AND COMMUNICATION APPARATUS

(71) Applicant: Murata Manufacturing Co., Ltd., Nagaokakyo-shi, Kyoto-fu (JP)

(72) Inventor: Koji Nosaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/283,882

(22) Filed: Feb. 25, 2019

(65) Prior Publication Data

US 2019/0190491 A1    Jun. 20, 2019

Related U.S. Application Data

(63) Continuation of application No. PCT/JP2017/031269, filed on Aug. 30, 2017.

(30) Foreign Application Priority Data

Sep. 2, 2016    (JP) ................. 2016-172190

(51) Int. Cl.
*H03H 9/56*    (2006.01)
*H03H 9/13*    (2006.01)
*H03H 9/205*    (2006.01)
*H03H 9/54*    (2006.01)
*H04B 1/40*    (2015.01)

(52) U.S. Cl.
CPC ............ *H03H 9/568* (2013.01); *H03H 9/132* (2013.01); *H03H 9/205* (2013.01); *H03H 9/542* (2013.01); *H04B 1/40* (2013.01)

(58) Field of Classification Search
CPC ............................. H03H 9/568; H03H 9/132
See application file for complete search history.

(56) References Cited

U.S. PATENT DOCUMENTS

| | | |
|---|---|---|
| 2009/0201104 A1 | 8/2009 | Ueda et al. |
| 2013/0113576 A1* | 5/2013 | Inoue ............ H03H 9/6433 333/133 |
| 2013/0127566 A1 | 5/2013 | Iwaki et al. |

FOREIGN PATENT DOCUMENTS

| | | | |
|---|---|---|---|
| JP | 2009-207116 A | 9/2009 | |
| JP | 2013-110595 A | 6/2013 | |
| JP | 2014-068123 | * 4/2014 | ............ H03H 9/64 |
| JP | 2014-068123 A | 4/2014 | |

OTHER PUBLICATIONS

Official Communication issued in International Patent Application No. PCT/JP2017/031269, dated Nov. 14, 2017.

* cited by examiner

*Primary Examiner* — Tuan H Nguyen
(74) *Attorney, Agent, or Firm* — Keating & Bennett, LLP

(57) ABSTRACT

A filter includes a series-arm resonator connected to a path connecting input/output terminals, and first and second parallel-arm resonators connected between the same node on the path and ground. A resonant frequency of the second parallel-arm resonator is higher than a resonant frequency of the first parallel-arm resonator, and an anti-resonant frequency of the second parallel-arm resonator is higher than an anti-resonant frequency of the first parallel-arm resonator. The second parallel-arm resonator includes an IDT electrode that excites an acoustic wave, and does not include a reflector.

19 Claims, 16 Drawing Sheets

ACOUSTIC WAVE FILTER DEVICE, RADIO-FREQUENCY FRONT-END CIRCUIT, AND COMMUNICATION APPARATUS

CROSS REFERENCE TO RELATED APPLICATIONS

This application claims the benefit of priority to Japanese Patent Application No. 2016-172190 filed on Sep. 2, 2016 and is a Continuation Application of PCT Application No. PCT/JP2017/031269 filed on Aug. 30, 2017. The entire contents of each of these applications are hereby incorporated herein by reference.

BACKGROUND OF THE INVENTION

1. Field of the Invention

The present invention relates to an acoustic wave filter device including resonators, a radio-frequency front-end circuit, and a communication apparatus.

2. Description of the Related Art

A known acoustic wave filter device such as a ladder filter includes a single parallel arm connecting a series arm and ground and including a first parallel-arm resonator and a plurality of second parallel-arm resonators connected in parallel to the first parallel-arm resonator while the plurality of second parallel-arm resonators are connected in series with each other (see, for example, Japanese Unexamined Patent Application Publication No. 2014-68123). In this acoustic wave filter device, the plurality of second parallel-arm resonators have resonant frequencies higher than an anti-resonant frequency of one or more series-arm resonators, and at least one of the plurality of second parallel-arm resonators has an anti-resonant frequency different from an anti-resonant frequency of the other second parallel-arm resonator(s). This configuration enables the acoustic wave filter device to increase the width of an attenuation range having a large attenuation within a specific frequency band in the stop band (attenuation band).

With the recent support for multi-band operation or the like, there is a demand for further reduction in the size of an acoustic wave filter device. With the recent support for multi-band operation or the like, furthermore, a filter disposed in a front-end portion of a mobile communication device is required to have low loss and high selectivity (prevention of mutual interference with other bands adjacent to its own band). That is, for filter characteristics, it is required to reduce the loss within the pass band and to improve the steepness of attenuation slopes (called the "sharpness of the pass band edges").

However, in the known acoustic wave filter device described above, no consideration is given to the reduction in the size of the acoustic wave filter device. Simply reducing the size of an acoustic wave filter device may deteriorate the capabilities of the acoustic wave filter device. Specifically, the loss within the pass band may increase, and the sharpness on the high-frequency side of the pass band may deteriorate.

The sharpness on the high-frequency side of the pass band refers to, specifically, the steepness of a higher-side attenuation slope among two attenuation slopes from the pass band to the attenuation band on both sides of the pass band.

SUMMARY OF THE INVENTION

Preferred embodiments of the present invention provide acoustic wave filter devices, radio-frequency front-end circuits, and communication apparatuses in each of which the size of the acoustic wave filter device is able to be reduced with a reduced or prevented increase in loss within the pass band and reduced or prevented deterioration of the sharpness on the high-frequency side of the pass band.

An acoustic wave filter device according to a preferred embodiment of the present invention includes a series-arm resonant circuit that is connected on a path connecting a first input/output terminal and a second input/output terminal, and a first parallel-arm resonator and a second parallel-arm resonator that are connected between the same node on the path and ground. A resonant frequency of the second parallel-arm resonator is higher than a resonant frequency of the first parallel-arm resonator, and an anti-resonant frequency of the second parallel-arm resonator is higher than an anti-resonant frequency of the first parallel-arm resonator. The second parallel-arm resonator includes an IDT electrode that excites an acoustic wave, and does not include a reflector.

As a result of intensive research, the inventor of preferred embodiments of the present invention made the following discoveries. For impedance characteristics of a resonator alone, there is a large difference in Q at the anti-resonant frequency, but there is no large difference in Q at the resonant frequency when the resonator includes reflectors and when the resonator includes no reflector. Thus, the decrease in Q at the resonant frequency is small even when the second parallel-arm resonator does not include a reflector, which reduces or prevents the increase in loss within the pass band and the deterioration of the sharpness on the high-frequency side of the pass band. In addition, since the second parallel-arm resonator does not include a reflector, the size of the acoustic wave filter device is able to be reduced by an amount corresponding to the space required for the reflectors. Accordingly, the size of an acoustic wave filter device is able to be reduced with a reduced or prevented increase in loss within the pass band and reduced or prevented deterioration of the sharpness on the high-frequency side of the pass band.

The first parallel-arm resonator may include an IDT electrode that excites an acoustic wave, and a reflector that reflects the acoustic wave excited by the IDT electrode.

For filter characteristics, the higher the Q at the resonant frequency of the second parallel-arm resonator and the higher the Q at the anti-resonant frequency of the first parallel-arm resonator, the more the increase in loss within the pass band and the deterioration of the sharpness on the high-frequency side of the pass band is able to be reduced or prevented. Thus, for the first parallel-arm resonator including reflectors, the Q at the anti-resonant frequency is designed to have a high value, which reduces the loss within the pass band and improves the sharpness on the high-frequency side of the pass band.

An acoustic wave filter device according to a preferred embodiment of the present invention includes a series-arm resonant circuit including one or more acoustic wave resonators that are connected between a first input/output terminal and a second input/output terminal, and a first parallel-arm resonator and a second parallel-arm resonator that are connected between the same node on a path connecting the first input/output terminal and the second input/output terminal and ground. A resonant frequency of the second parallel-arm resonator is higher than a resonant frequency of the first parallel-arm resonator, and an anti-resonant frequency of the second parallel-arm resonator is higher than an anti-resonant frequency of the first parallel-arm resonator. Each of the first parallel-arm resonator and the second parallel-arm resonator includes an IDT electrode that excites an acoustic wave, and a reflector that reflects the acoustic wave excited by the IDT electrode. The reflector in the second parallel-arm resonator includes fewer electrode fingers than the reflector in the first parallel-arm resonator.

As a result of intensive research, the inventor of preferred embodiments of the present invention has made the following discoveries. For impedance characteristics of a resonator alone, there is a large difference in Q at the anti-resonant frequency, but there is no large difference in Q at the resonant frequency between when a reflector included in the resonator includes many electrode fingers and when it includes a few electrode fingers. For filter characteristics, the higher the Q at the resonant frequency of the second parallel-arm resonator and the higher the Q at the anti-resonant frequency of the first parallel-arm resonator, the more the increase in loss within the pass band and the deterioration of the sharpness on the high-frequency side of the pass band is able to be reduced or prevented. Thus, the number of electrode fingers of a reflector included in the second parallel-arm resonator is smaller than the number of electrode fingers of a reflector included in the first parallel-arm resonator, which enables the Q at the anti-resonant frequency of the first parallel-arm resonator to be higher and enables the decrease in Q at the resonant frequency of the second parallel-arm resonator to be smaller. This reduces or prevents the increase in loss within the pass band and the deterioration of the sharpness on the high-frequency side of the pass band. In addition, since a reflector included in the second parallel-arm resonator includes fewer electrode fingers, the size of the acoustic wave filter device is able to be reduced by an amount corresponding to the space required for an unnecessary number of electrode fingers. Accordingly, the size of an acoustic wave filter device is able to be reduced with a reduced or prevented increase in loss within the pass band and reduced or prevented deterioration of the sharpness on the high-frequency side of the pass band.

The series-arm resonant circuit may include one or more IDT electrodes that excite an acoustic wave, and a reflector that reflects the acoustic wave excited by the one or more IDT electrodes. The reflector in the second parallel-arm resonator may include fewer electrode fingers than the reflector in the series-arm resonant circuit.

The pass band and the attenuation band of a filter is defined by the resonant frequency and the anti-resonant frequency of a series-arm resonant circuit and the resonant frequency and the anti-resonant frequency of a parallel-arm resonant circuit (in this aspect, a parallel-connected circuit of the first parallel-arm resonator and the second parallel-arm resonator). As described above, for impedance characteristics of a resonator alone, there is a large difference in Q at the anti-resonant frequency and there is also a difference in Q at the resonant frequency between when a reflector included in the resonator includes many electrode fingers and when it includes a few electrode fingers. Accordingly, more electrode fingers are included in a reflector of the series-arm resonant circuit, thus enabling an increase in the Qs at the resonant frequency and the anti-resonant frequency of the series-arm resonant circuit and enabling further reduction or prevention of the increase in loss within the pass band and the deterioration of the sharpness on the high-frequency side of the pass band.

Further, the first parallel-arm resonator and the second parallel-arm resonator may be connected in parallel.

The acoustic wave filter device may further include an impedance element and a switch element that are connected in parallel and that are connected in series with at least one of the first parallel-arm resonator and the second parallel-arm resonator.

Accordingly, it is possible to provide a tunable filter that switches between a first bandpass characteristic and a second bandpass characteristic in accordance with the connection or disconnection of the switch element.

Further, the impedance element and the switch element that are connected in parallel may be connected in series with only the second parallel-arm resonator of the first and second parallel-arm resonators.

Accordingly, it is possible to provide a tunable filter that is capable of switching the attenuation pole frequency on the high-frequency side of the pass band in accordance with switching between the connection and disconnection of the switch element and that is capable of reducing or preventing the increase in insertion loss at the high-frequency end of the pass band.

Alternatively, the impedance element and the switch element that are connected in parallel may be connected in series with only the first parallel-arm resonator of the first and second parallel-arm resonators.

Accordingly, it is possible to provide a tunable filter that is capable of switching the attenuation pole frequency on the low-frequency side of the pass band in accordance with switching between the connection and disconnection of the switch element and that is capable of reducing or preventing the increase in insertion loss at the low-frequency end of the pass band.

Alternatively, the impedance element and the switch element that are connected in parallel may be connected in series with a circuit including the first parallel-arm resonator and the second parallel-arm resonator that are connected in parallel.

Accordingly, it is possible to provide a tunable filter that is capable of switching both pole (attenuation pole) frequencies on both sides of the pass band in accordance with switching between the connection and disconnection of the switch element.

The acoustic wave filter device may further include an impedance element and a switch element that are connected in parallel and that are connected in series with only the first parallel-arm resonator of the first and second parallel-arm resonators, and another impedance element and another switch element that are connected in parallel and that are connected in series with only the first parallel-arm resonator of the first and second parallel-arm resonators.

Accordingly, it is possible to provide a tunable filter that is capable of switching the attenuation pole frequencies on the high-frequency side of the pass band and the low-frequency side of the pass band in accordance with switching between the connection and disconnection of the switch element and that is capable of reducing or preventing the increase in insertion loss at the high-frequency end of the pass band and at the low-frequency end of the pass band. Thus, such a tunable filter is able to, for example, shift the center frequency while maintaining the band width.

Further, the first parallel-arm resonator and the second parallel-arm resonator may be connected in series.

The acoustic wave filter device may further include a switch element connected in parallel to one of the first parallel-arm resonator and the second parallel-arm resonator.

Accordingly, it is possible to provide a tunable filter that is capable of switching the attenuation pole frequency on the low-frequency side of the pass band in accordance with switching between the connection and disconnection of the switch element and that obtains attenuation on the high-frequency side of the pass band due to the generation of an additional attenuation pole on the high-frequency side of the pass band.

Further, the series-arm resonant circuit may be a series-arm resonator including one or more acoustic wave resonators, and the series-arm resonant circuit, the first parallel-arm resonator, and the second parallel-arm resonator may have a ladder filter structure.

Accordingly, it is possible to provide a ladder band pass filter and to achieve a steep bandpass characteristic.

Further, the series-arm resonant circuit may be a longitudinally coupled resonator including a plurality of acoustic wave resonators.

Accordingly, filter characteristic requirements, such as attenuation improvement, are able to be satisfied.

A radio-frequency front-end circuit according to a preferred embodiment of the present invention includes an acoustic wave filter device according to a preferred embodiment of the present invention, and an amplifier circuit connected to the acoustic wave filter device.

Accordingly, it is possible to provide a radio-frequency front-end circuit in which the size of an acoustic wave filter device is reduced with a reduced or prevented increase in loss within the pass band and reduced or prevented deterioration of the sharpness on the high-frequency side of the pass band.

A communication apparatus according to a preferred embodiment of the present invention includes an RF signal processing circuit that processes a radio-frequency signal transmitted or received by an antenna element, and a radio-frequency front-end circuit according to a preferred embodiment of the present invention that transmits the radio-frequency signal between the antenna element and the RF signal processing circuit.

Accordingly, it is possible to provide a communication apparatus in which the size of an acoustic wave filter device is reduced with a reduced or prevented increase in loss within the pass band and reduced or prevented deterioration of the sharpness on the high-frequency side of the pass band.

Acoustic wave filter devices, radio-frequency front-end circuits, and communication apparatuses according to preferred embodiments of the present invention are each able to be reduced in size while reducing or preventing the increase in loss within the pass band and the deterioration of the sharpness on the high-frequency side of the pass band.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
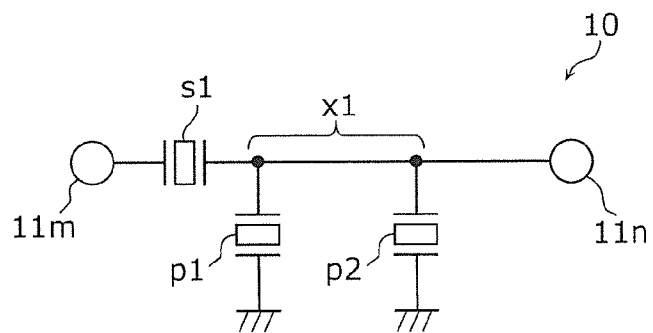
FIG. 1A is a circuit configuration diagram of a filter according to a Preferred Embodiment 1 of the present invention.

Preferred embodiments of the present invention will be described in detail with reference to Examples and the drawings. All of the preferred embodiments described below provide general or specific examples. The values, shapes, materials, elements, the arrangements and connection structures of the elements, which are provided in the following preferred embodiments, are examples and are not intended to limit the present invention. The elements described in the following preferred embodiments are described as optional elements unless they are specified in the independent claims. In addition, the elements illustrated in the drawings are not representative of exact proportions or dimensions. Additionally, in the drawings, the same or substantially the same elements are denoted by the same reference numerals, and any redundant description will be omitted or may be briefly provided.

Preferred Embodiment 1

FIG. 1A is a circuit configuration diagram of a filter 10 according to a Preferred Embodiment 1 of the present invention.

The filter 10 is preferably a radio frequency filter circuit provided in a front-end portion of a multi-mode/multi-band cellular phone, for example. The filter 10 is preferably a band pass filter included in a multi-band cellular phone complying with a communication standard such as LTE (Long Term Evolution), for example, and configured to filter radio-frequency signals in a predetermined band. The filter 10 is preferably an acoustic wave filter device, for example, that filters radio-frequency signals by using acoustic wave resonators.

As illustrated in FIG. 1A, the filter 10 includes a series-arm resonator s1 and parallel-arm resonators p1 and p2.

The series-arm resonator s1 is connected between an input/output terminal 11m (first input/output terminal) and an input/output terminal 11n (second input/output terminal). That is, the series-arm resonator s1 is a series-arm resonant circuit disposed in a path connecting the input/output terminal 11m and the input/output terminal 11n. The series-arm resonant circuit may be provided with, instead of the series-arm resonator s1, a series-arm resonant circuit including one or more acoustic wave resonators. In the present preferred embodiment, the series-arm resonant circuit includes a single acoustic wave resonator. However, the series-arm resonant circuit may include a plurality of acoustic wave resonators. A series-arm resonant circuit including a plurality of acoustic wave resonators includes, for example, a longitudinally coupled resonator including a plurality of acoustic wave resonators, or a plurality of sub-resonators into which, for example, a single acoustic wave resonator is divided in series. For example, a longitudinally coupled resonator used as a series-arm resonant circuit is able to satisfy required filter characteristics, such as attenuation improvement.

The parallel-arm resonator p1 is a first parallel-arm resonator connected to a node (in FIG. 1A, a node x1) on the path connecting the input/output terminal 11m and the input/output terminal 11n and to ground (reference terminal). That is, the parallel-arm resonator p1 is disposed in a parallel-arm resonant circuit connecting the node x1 on the path and ground.

The parallel-arm resonator p2 is a second parallel-arm resonator connected to a node (in FIG. 1A, the node x1) on the path connecting the input/output terminal 11m and the input/output terminal 11n and to ground (reference terminal). That is, the parallel-arm resonator p2 is disposed in a parallel-arm resonant circuit connecting the node x1 on the path and ground.

The parallel-arm resonators p1 and p2 are connected between the same node x1 on the path and ground. In the present preferred embodiment, the parallel-arm resonators p1 and p2 are connected in parallel and are connected between the node x1 and ground. As used here, the term "the same node" includes not only a single node on a transmission line but also two different nodes on a transmission line, which are located with no resonator or impedance element therebetween. In the present preferred embodiment, the node x1 is located on the side of the series-arm resonator s1 closer to the input/output terminal 11n. Alternatively, the node x1 may be located on the side of the series-arm resonator s1 closer to the input/output terminal 11m.

Further, the parallel-arm resonators p1 and p2 define a parallel-arm resonant circuit connected between ground and the node x1 on the path (on the series arm) connecting the input/output terminal 11m and the input/output terminal 11n. That is, the parallel-arm resonant circuit is disposed in a single parallel arm connecting a series arm and ground. Thus, a series-arm resonant circuit (in the present preferred embodiment, the series-arm resonator s1) and a parallel-arm resonant circuit (in the present preferred embodiment, the parallel-arm resonators p1 and p2) define a ladder filter structure (in the present preferred embodiment, a single-stage ladder filter structure).

That is, the parallel-arm resonant circuit including the parallel-arm resonators p1 and p2, and the series-arm resonator s1 define the pass band of the filter 10.

Next, the structure of the filter 10 will be described.

Figure 1B:
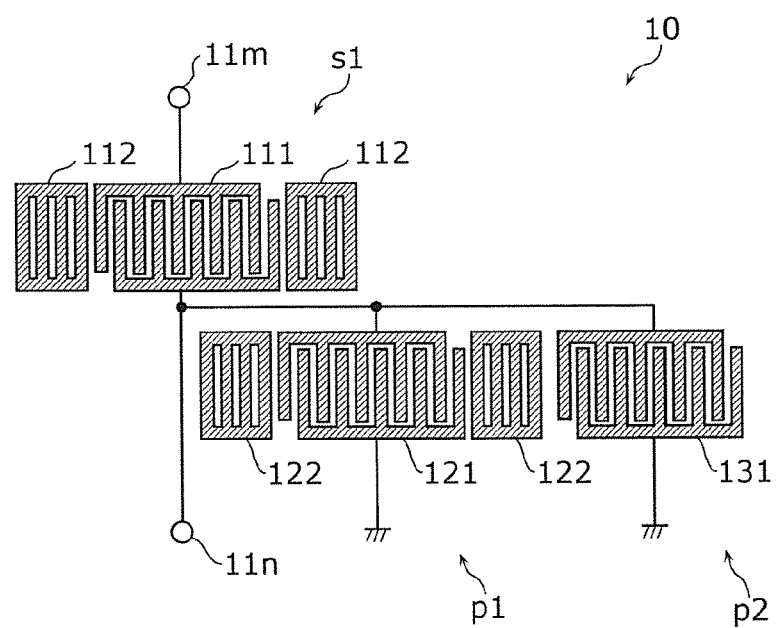
FIG. 1B is a schematic plan view of an electrode structure of the filter according to the Preferred Embodiment 1 of the present invention.

FIG. 1B is a schematic plan view of an electrode structure of the filter 10 according to Preferred Embodiment 1.

As illustrated in FIG. 1B, the resonators included in the filter 10 (the series-arm resonator s1 and the parallel-arm resonators p1 and p2) are each preferably an acoustic wave resonator that uses an acoustic wave, for example. Accordingly, the filter 10 includes IDT (InterDigital Transducer) electrodes on a substrate with piezoelectric properties, and thus a compact, low-profile filter circuit having a bandpass characteristic with high steepness is able to be obtained. The substrate with piezoelectric properties is preferably a substrate, at least a surface of which has piezoelectric properties, for example. The substrate may be, for example, a multilayer body including a piezoelectric thin film on a surface thereof and including a film having a different acoustic velocity from the piezoelectric thin film, a support substrate, and other suitable layers or films. Alternatively, the substrate may be, for example, a multilayer body including a high-acoustic-velocity support substrate and a piezoelectric thin film disposed on the high-acoustic-velocity support substrate, a multilayer body including a high-acoustic-velocity support substrate, a low-acoustic-velocity film disposed on the high-acoustic-velocity support substrate, and a piezoelectric thin film disposed on the low-acoustic-velocity film, or a multilayer body including a support substrate, a high-acoustic-velocity film disposed on the support substrate, a low-acoustic-velocity film disposed on the high-acoustic-velocity film, and a piezoelectric thin film disposed on the low-acoustic-velocity film. The entire substrate may have piezoelectric properties.

Each of the series-arm resonator s1 and the parallel-arm resonator p1 includes an IDT electrode that excites an acoustic wave, and a pair of reflectors, each disposed on either side of the IDT electrode in the propagation direction such that the reflectors reflect the acoustic wave excited by the IDT electrode. Specifically, the series-arm resonator s1 includes an IDT electrode 111 and a pair of reflectors 112. The parallel-arm resonator p1 includes an IDT electrode 121 and a pair of reflectors 122.

In contrast, the parallel-arm resonator p2 (second parallel-arm resonator) includes an IDT electrode 131 that excites an acoustic wave, and does not include a reflector.

The resonant frequency of the parallel-arm resonator p2 (second parallel-arm resonator) is higher than the resonant frequency of the parallel-arm resonator p1 (first parallel-arm resonator). The resonant frequency of a resonator is the frequency at a singularity at which the impedance reaches a local minimum (ideally, a point at which the impedance reaches 0). Further, the anti-resonant frequency of the parallel-arm resonator p2 is higher than the anti-resonant frequency of the parallel-arm resonator p1. The anti-resonant frequency of a resonator is the frequency at a singularity at which the impedance reaches a local maximum (ideally, a point at which the impedance becomes infinite).

In the present preferred embodiment, the IDT electrodes 111, 121, and 131 preferably include the same number of pairs of electrode fingers. Alternatively, the number of pairs of electrode fingers of at least one IDT electrode may be different from the numbers of pairs of electrode fingers of the other IDT electrodes.

The following describes the structure of each of the resonators included in the filter 10 in more detail, focusing on a particular one of the resonators. The other resonators have the same or substantially the same structure as the particular resonator and will not be described in detail herein.

Figure 2:
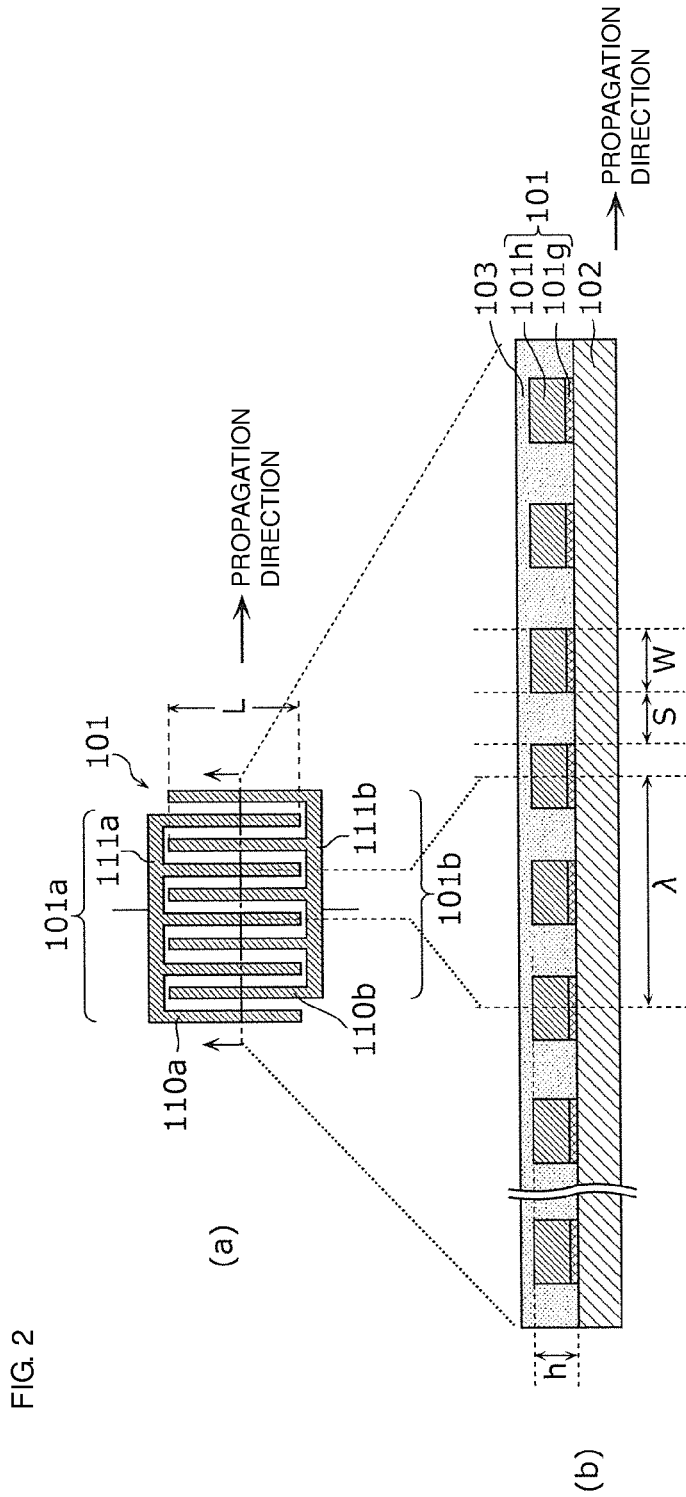
FIG. 2 is an example schematic diagram of the structure of a resonator in the Preferred Embodiment 1 of the present invention.

FIG. 2 is an example schematic diagram of the structure of a resonator in the present preferred embodiment, in which part (a) is a plan view of the resonator and part (b) is a cross-sectional view of the resonator illustrated in part (a). The resonator illustrated in FIG. 2 is for the purpose of illustration of a typical structure of each of the resonators included in the filter 10. For this reason, the number, length, and other parameters of electrode fingers of an IDT electrode of each resonator in the filter 10 are not limited to the number and length of electrode fingers of an IDT electrode illustrated in FIG. 2. In FIG. 2, reflectors included in the resonator are not illustrated.

As illustrated in parts (a) and (b) of FIG. 2, the resonator includes an IDT electrode 101, a piezoelectric substrate 102 with the IDT electrode 101 provided thereon, and a protection layer 103 that covers the IDT electrode 101. These components will be described in detail hereinafter.

As illustrated in part (a) of FIG. 2, a pair of opposing comb electrodes 101a and 101b, which define the IDT electrode 101, are disposed on the piezoelectric substrate 102. The comb electrode 101a includes a plurality of parallel electrode fingers 110a and a busbar electrode 111a that connects the plurality of electrode fingers 110a together. The comb electrode 101b includes a plurality of parallel electrode fingers 110b and a busbar electrode 111b that connects the plurality of electrode fingers 110b together. The pluralities of electrode fingers 110a and 110b extend in a direction perpendicular or substantially perpendicular to the propagation direction.

The comb electrodes 101a and 101b may each be referred to alone as IDT electrode. In the following description, however, the pair of comb electrodes 101a and 101b define a single IDT electrode 101, for convenience of description.

Further, as illustrated in part (b) of FIG. 2, the IDT electrode 101, which includes the pluralities of electrode fingers 110a and 110b and the busbar electrodes 111a and 111b, preferably has a multilayer structure including a close contact layer 101g and a main electrode layer 101h.

The close contact layer 101g improves the contact between the piezoelectric substrate 102 and the main electrode layer 101h, and is preferably made of, for example, Ti. The close contact layer 101g preferably has a film thickness of, for example, about 12 nm.

The main electrode layer 101h is preferably made of, for example, Al containing about 1% of Cu. The main electrode layer 101h preferably has a film thickness of, for example, about 162 nm.

The piezoelectric substrate 102 on which the IDT electrode 101 is provided is preferably made of, for example, $LiTaO_3$ piezoelectric single crystal, $LiNbO_3$ piezoelectric single crystal, $KNbO_3$ piezoelectric single crystal, quartz, or piezoelectric ceramics.

The protection layer 103 covers the comb electrodes 101a and 101b. The protection layer 103 protects the main electrode layer 101h from the outside environment, adjusts the frequency temperature characteristics, and improves humidity resistance, and is preferably a film containing, for example, silicon dioxide as a main component.

The structure of each of the resonators included in the filter 10 is not limited to the structure depicted in FIG. 2. For example, the IDT electrode 101 may be a single-layer metal film, rather than having a multilayer structure including metal films. In addition, the materials of the close contact layer 101g, the main electrode layer 101h, and the protection layer 103 are not limited to those described above. Additionally, the IDT electrode 101 may be made of, for example, a metal such as Ti, Al, Cu, Pt, Au, Ag, or Pd, or an alloy, or may include a plurality of multilayer bodies made of the metal or alloy. Further, the protection layer 103 is optional.

In a resonator (acoustic wave resonator) having the configuration described above, the design parameters of the IDT electrode 101 define the wavelength of the acoustic wave to be excited. That is, the design parameters of the IDT electrode 101 define the resonant frequency and anti-resonant frequency of the resonator. The following describes the design parameters of the IDT electrode 101, that is, the design parameters of the comb electrode 101a and the comb electrode 101b.

The wavelength of the acoustic wave is defined by a repetition period λ of the plurality of electrode fingers 110a or 110b of the comb electrodes 101a and 101b illustrated in FIG. 2. An electrode pitch (electrode period) is equal to ½ of the repetition period λ and is defined by (W+S), where W denotes the line width of the electrode fingers 110a and 110b of the comb electrodes 101a and 101b, and S denotes the width of the space between one of the electrode fingers 110a and one of the electrode fingers 110b, which are adjacent to each other. Further, as illustrated in part (a) of FIG. 2, an overlap width L of the IDT electrode 101 corresponds to the length of an overlap portion of the electrode fingers 110a of the comb electrode 101a and the electrode fingers 110b of the comb electrode 101b when viewed in the acoustic wave propagation direction. Further, an electrode duty (duty ratio) is the proportion of the line width of the pluralities of electrode fingers 110a and 110b, and corresponds to the ratio of the line width of the pluralities of electrode fingers 110a and 110b to the sum of the line width and the space width of the pluralities of electrode fingers 110a and 110b, which is defined by W/(W+S). Further, the number of pairs of electrode fingers refers to the number of paired electrode fingers 110a and 110b of the comb electrodes 101a and 101b, and is approximately half the total number of electrode fingers 110a and 110b. For example, when the number of pairs of electrode fingers is denoted by N and the total number of electrode fingers 110a and 110b is denoted by M, then M=2N+1 is satisfied. That is, the number of regions between the distal end of one electrode finger of one of the comb electrodes 101a and 101b and the busbar electrode of the other comb electrode, which faces the distal end, is equal to about 0.5 pairs. Further, the film thickness of the IDT electrode 101 refers to a thickness h of the pluralities of electrode fingers 110a and 110b.

Next, filter characteristics of the filter 10 according to the present preferred embodiment will be described.

In the following, for convenience of description, for not only a resonator alone but also a circuit including a plurality of resonators, a singularity at which the impedance reaches a local minimum (ideally, a point at which the impedance reaches 0) is referred to as "resonant frequency". Further, a singularity at which the impedance reaches a local maximum (ideally, a point at which the impedance becomes infinite) is referred to as "anti-resonant frequency".

Figure 3:
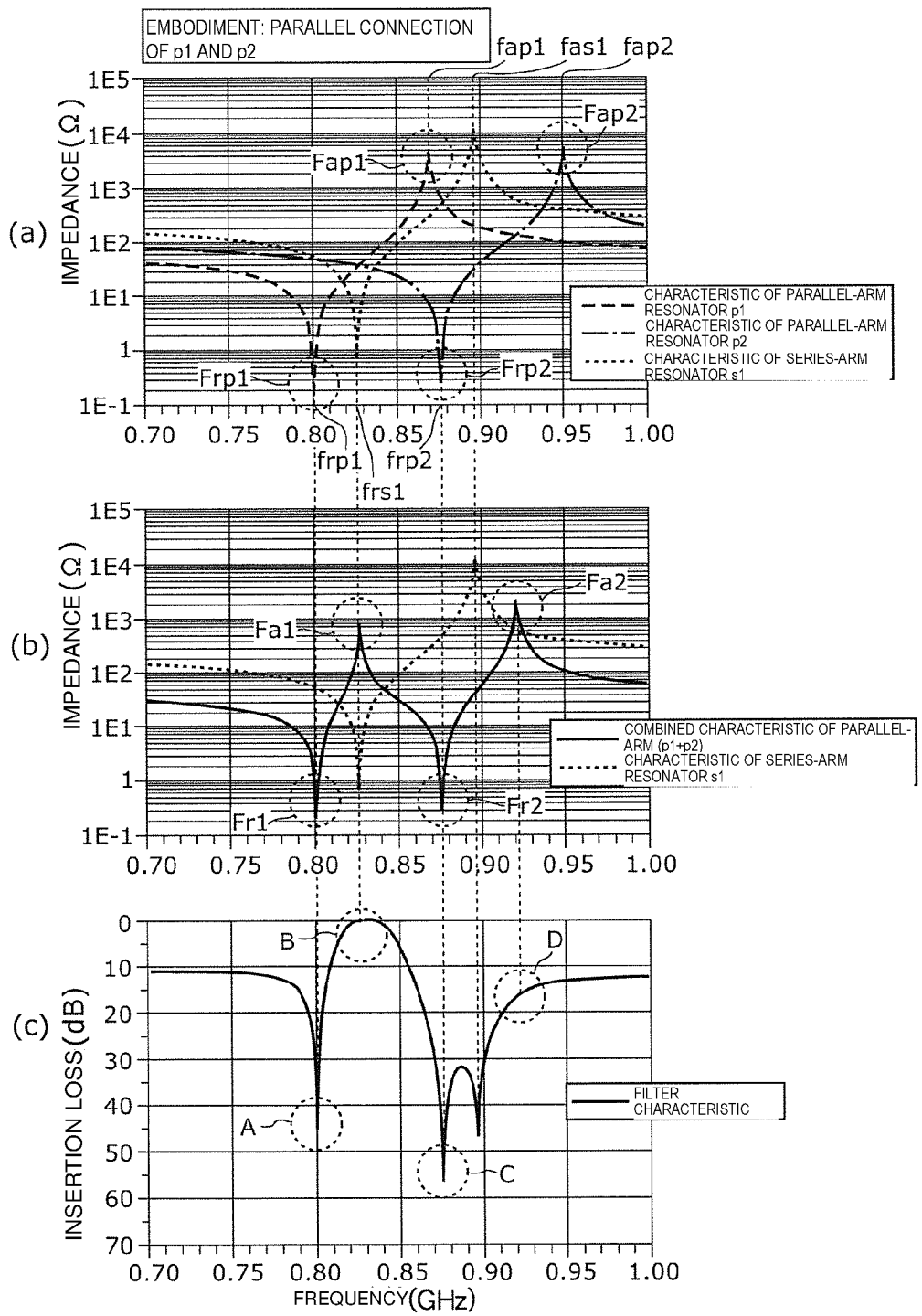
FIG. 3 illustrates graphs depicting characteristics of the filter according to the Preferred Embodiment 1 of the present invention.

FIG. 3 illustrates graphs depicting characteristics of the filter 10 according to the Preferred Embodiment 1. Specifically, part (a) of FIG. 3 is a graph depicting the respective impedance characteristics of the parallel-arm resonators p1 and p2 and the series-arm resonator s1. Part (b) of FIG. 3 is a graph depicting the combined impedance characteristic (combined characteristic) of the parallel-arm resonators p1 and p2 and the impedance characteristic of the series-arm resonator s1. Part (c) of FIG. 3 is a graph depicting a filter characteristic of the filter 10.

First, the impedance characteristics of resonators alone will be described with reference to part (a) of FIG. 3.

As illustrated in FIG. 3, the parallel-arm resonator p1, the parallel-arm resonator p2, and the series-arm resonator s1 have the following impedance characteristics. Specifically, when the parallel-arm resonator p1, the parallel-arm resonator p2, and the series-arm resonator s1 have resonant frequencies frp1, frp2, and frs1 and anti-resonant frequencies fap1, fap2, and fas1, respectively, then in the present preferred embodiment, frp1<frs1<frp2 and fap1<fas1<fap2 are preferably satisfied.

Next, the combined characteristic of the parallel-arm resonator p1 and the parallel-arm resonator p2 (i.e., the impedance characteristic of a parallel-arm resonant circuit) will be described.

As illustrated in part (b) of FIG. 3, the combined characteristic of the two parallel-arm resonators (the parallel-arm resonators p1 and p2) ("combined characteristic of parallel-arm (p1+p2)" in FIG. 3) reaches a local minimum (Fr2 and Fr1 in FIG. 3) at the resonant frequency frp2 of the parallel-arm resonator p2 and at the resonant frequency frp1 of the parallel-arm resonator p1. Further, the combined characteristic reaches a local maximum (Fa1 and Fa2 in FIG. 3) at a frequency between the two resonant frequencies frp2 and frp1 and at a frequency between the two anti-resonant frequencies fap2 and fap1.

For a band pass filter including ladder resonators, the lower anti-resonant frequency among the two anti-resonant frequencies of the parallel-arm resonant circuit and the resonant frequency frs1 of the series-arm resonator s1 are set to be close to each other to define a pass band.

Accordingly, as illustrated in part (c) of FIG. 3, an attenuation band including the resonant frequency frp1 of the parallel-arm resonator p1 as an attenuation pole is generated on the low-frequency side of the pass band, and an attenuation band including the resonant frequency frp2 of the parallel-arm resonator p2 and the anti-resonant frequency fas1 of the series-arm resonator s1 as attenuation poles is generated on the high-frequency side of the pass band.

In the combined impedance characteristic of the parallel-arm resonator p1 and the parallel-arm resonator p2, the lower anti-resonant frequency (Fa1 in FIG. 3) and the higher resonant frequency (Fr2 in FIG. 3) define an attenuation slope on the high-frequency side of the pass band of the filter 10. That is, the sharpness of the attenuation slope on the high-frequency side of the pass band is affected by the sharpness of the slope between the lower anti-resonant frequency (Fa1 in FIG. 3) and the higher resonant frequency (Fr2 in FIG. 3) in the combined impedance characteristic. Thus, the Q at the anti-resonant frequency (Fap1 in FIG. 3) of the parallel-arm resonator p1 and the Q at the resonant frequency (Frp2 in FIG. 3) of the parallel-arm resonator p2 affect the sharpness on the high-frequency side of the pass band. Specifically, as the Q at the anti-resonant frequency of the parallel-arm resonator p1 increases, the Q at the lower anti-resonant frequency (Fa1 in FIG. 3) increases in the combined impedance characteristic of a parallel-arm resonant circuit (in the present preferred embodiment, a parallel-connected circuit of the parallel-arm resonators p1 and p2). In contrast, as the Q at the resonant frequency of the parallel-arm resonator p2 increases, the Q at the higher resonant frequency (Fr2 in FIG. 3) increases in the combined impedance characteristic of the parallel-arm circuit. Accordingly, an improvement in the sharpness of the slope between the lower anti-resonant frequency and the higher resonant frequency (between Fa1 and Fr2 in FIG. 3) in the combined impedance characteristic is able to improve the sharpness on the high-frequency side of the pass band in the filter characteristic described above. In other words, the higher the Q at the resonant frequency of the parallel-arm resonator p2, the higher the Q at the attenuation pole (portion C in FIG. 3) on the high-frequency side of the pass band becomes (i.e., the deeper the attenuation pole becomes); the higher the Q at the anti-resonant frequency of the parallel-arm resonator p1, the more the loss within the pass band (portion B in FIG. 3) is reduced. Accordingly, the sharpness on the high-frequency side of the pass band is able to be improved.

Furthermore, near the lower anti-resonant frequency, the combined impedance characteristic of the parallel-arm resonant circuit corresponds to a characteristic obtained by combining the capacitance component of the parallel-arm resonator p2 with the characteristic of the parallel-arm resonator p1. Accordingly, in addition to increasing the Q at the anti-resonant frequency of the parallel-arm resonator p1, increasing the Q of the capacitance component of the parallel-arm resonator p2, that is, reducing the series resistance of the parallel-arm resonator p2, reduces the loss within the pass band of the filter 10.

In the combined impedance characteristic of the parallel-arm resonator p1 and the parallel-arm resonator p2, furthermore, the lower resonant frequency (Fr1 in FIG. 3) defines an attenuation slope on the low-frequency side of the pass band of the filter 10. Thus, the Q at the resonant frequency (Frp1 in FIG. 3) of the parallel-arm resonator p1 affects the sharpness on the low-frequency side of the pass band. Specifically, as the Q at the resonant frequency of the parallel-arm resonator p1 increases, the Q at the lower resonant frequency (Fr1 in FIG. 3) increases in the combined impedance characteristic of a parallel-arm resonant circuit (in the present preferred embodiment, a parallel-connected circuit of the parallel-arm resonators p1 and p2), thus improving the sharpness on the low-frequency side of the pass band. In other words, the higher the Q at the resonant frequency of the parallel-arm resonator p1, the higher the Q at the attenuation pole (portion A in FIG. 3) on the low-frequency side of the pass band becomes (i.e., the deeper the attenuation pole becomes), thus improving the sharpness on the low-frequency side of the pass band.

In contrast, in the combined impedance characteristic of the parallel-arm resonator p1 and the parallel-arm resonator p2, the higher anti-resonant frequency (Fa2 in FIG. 3), which corresponds to portion D in FIG. 3, is less likely to affect the pass band and the attenuation band of the filter 10. In other words, the Q at the anti-resonant frequency (Fap2 in FIG. 3) of the parallel-arm resonator p2 is less likely to affect the pass band and the attenuation band of the filter 10. Accordingly, a low Q at the anti-resonant frequency (Fap1 in FIG. 3) of the parallel-arm resonator p2 is less likely to affect the pass band and the attenuation band of the filter 10.

In the filter 10 according to the present preferred embodiment, as described above, the parallel-arm resonator p2 does not include a reflector. Thus, the size of an acoustic wave filter device is able to be reduced with a reduced or prevented increase in loss within the pass band and reduced of prevented deterioration of the sharpness on the high-frequency side of the pass band. The following describes the reasons for such advantageous effects, together with the circumstances leading to preferred embodiments of the present invention.

In an acoustic wave filter device, generally, resonators included in the acoustic wave filter device include reflectors in addition to IDT electrodes, in terms of low loss. To address this, the inventor of preferred embodiments of the present invention has discovered that even when a specific resonator among a plurality of resonators included in an acoustic wave filter device does not include a reflector, the deterioration of filter characteristics is able to be reduced or prevented, which may be utilized to reduce the size of the acoustic wave filter device. This will be described hereinafter based on a specific typical example.

In a Typical Example 1 described below, frequency bands are different from those in the present preferred embodiment. However, the tendency for the Qs at the resonant frequency and the anti-resonant frequency to change in dependence on the number of electrode fingers of reflectors is similar to that in the frequency bands in the present preferred embodiment. In the Typical Example described below, furthermore, different numbers of electrode fingers of a reflector are provided, with all IDT electrodes included in the resonators maintained the same.

Table 1 shows the details of the design parameters of a resonator in this case. In Table 1, fr represents the resonant frequency, fa represents the anti-resonant frequency, Qr represents the Q at the resonant frequency, and Qa represents the Q at the anti-resonant frequency.

TABLE 1

| Number of Electrode Fingers | fr [MHz] | fa [MHz] | Qr [—] | Qa [—] |
|---|---|---|---|---|
| 0 | 2449.5 | 2535.6 | 361.8 | 321.6 |
| (Typical Example 1-1) | | | | |
| 4 | 2449.5 | 2535.4 | 389.5 | 467.8 |
| (Typical Example 1-2) | | | | |
| 8 | 2449.4 | 2535.2 | 430.6 | 616.2 |
| (Typical Example 1-3) | | | | |
| 12 | 2449.4 | 2535.1 | 459.6 | 705.8 |
| (Typical Example 1-4) | | | | |
| 16 | 2449.2 | 2534.9 | 471.3 | 769.8 |
| (Typical Example 1-5) | | | | |
| 20 | 2449.4 | 2535.2 | 490.5 | 784.9 |
| (Typical Example 1-6) | | | | |
| 24 | 2449.5 | 2535.4 | 506.7 | 8027 |
| (Typical Example 1-7) | | | | |
| 32 | 2449.8 | 2535.5 | 510.1 | 830.5 |
| (Typical Example 1-8) | | | | |
| 40 | 2450.2 | 2535.4 | 511.2 | 867.4 |
| (Typical Example 1-9) | | | | |
| 60 | 2449.6 | 2535.3 | 507.8 | 875.2 |
| (Typical Example 1-10) | | | | |
| 80 | 2449.2 | 2535.2 | 507.1 | 873.6 |
| (Typical Example 1-11) | | | | |

Figure 4:
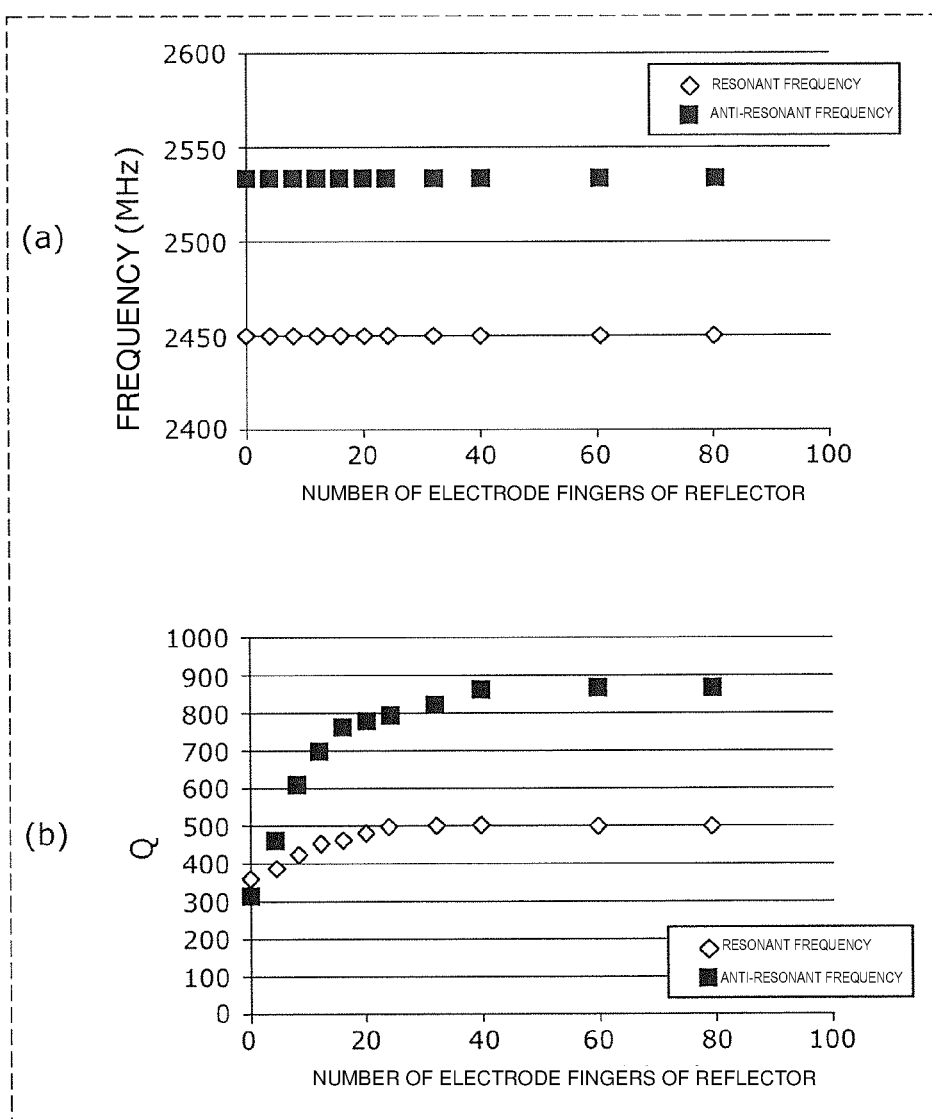
FIG. 4 illustrates graphs depicting frequency changes in resonant frequency and anti-resonant frequency and changes in Q when different numbers of electrode fingers of a reflector are assigned to resonators in a Typical Example 1.

Graphs depicting changes in resonant frequency and Q and changes in anti-resonant frequency and Q when different numbers of electrode fingers of a reflector are provided as set forth in Table 1 are illustrated in FIG. 4. FIG. 4 illustrates graphs depicting changes in resonant frequency and anti-resonant frequency and changes in Q when different numbers of electrode fingers of a reflector are provided in the resonators in the Typical Example 1. Part (a) of FIG. 4 is a graph depicting changes in resonant frequency and anti-resonant frequency, and part (b) of FIG. 4 is a graph depicting changes in Q for the resonant frequency and the anti-resonant frequency.

As illustrated in part (a) of FIG. 4, it is discovered that the resonant frequency and the anti-resonant frequency do not fluctuate even if the number of electrode fingers of a reflector changes. This is because the wavelength (i.e., frequency) of the acoustic wave is defined by the repetition period of a plurality of electrode fingers of an IDT electrode and is less likely to be affected by the difference in the number of electrode fingers between reflectors.

As illustrated in part (b) of FIG. 4, it is also discovered that the smaller the number of electrode fingers of a reflector, the lower the Q (Qa) at the anti-resonant frequency. In contrast, it is discovered that the fewer the electrode fingers of a reflector, the lower the Q (Qr) at the resonant frequency, with the amount of decrease in Q (Qr) at the resonant frequency being smaller. Thus, even when the number of electrode fingers of a reflector is 0, that is, even when a resonator includes no reflector, the amount of decrease in Q (Qr) at the resonant frequency of the resonator is smaller than that for a resonator including reflectors.

Accordingly, also with the filter 10 according to the Preferred Embodiment 1, in which the parallel-arm resonator p2 does not include a reflector, the size of an acoustic wave filter device is able to be reduced with a reduced or prevented increase in loss within the pass band and reduced or prevented deterioration of the sharpness on the high-frequency side of the pass band. In this respect, impedance characteristics when the parallel-arm resonator p2 includes reflectors and when the parallel-arm resonator p2 includes no reflector will be described with reference to FIG. 5.

Figure 5:
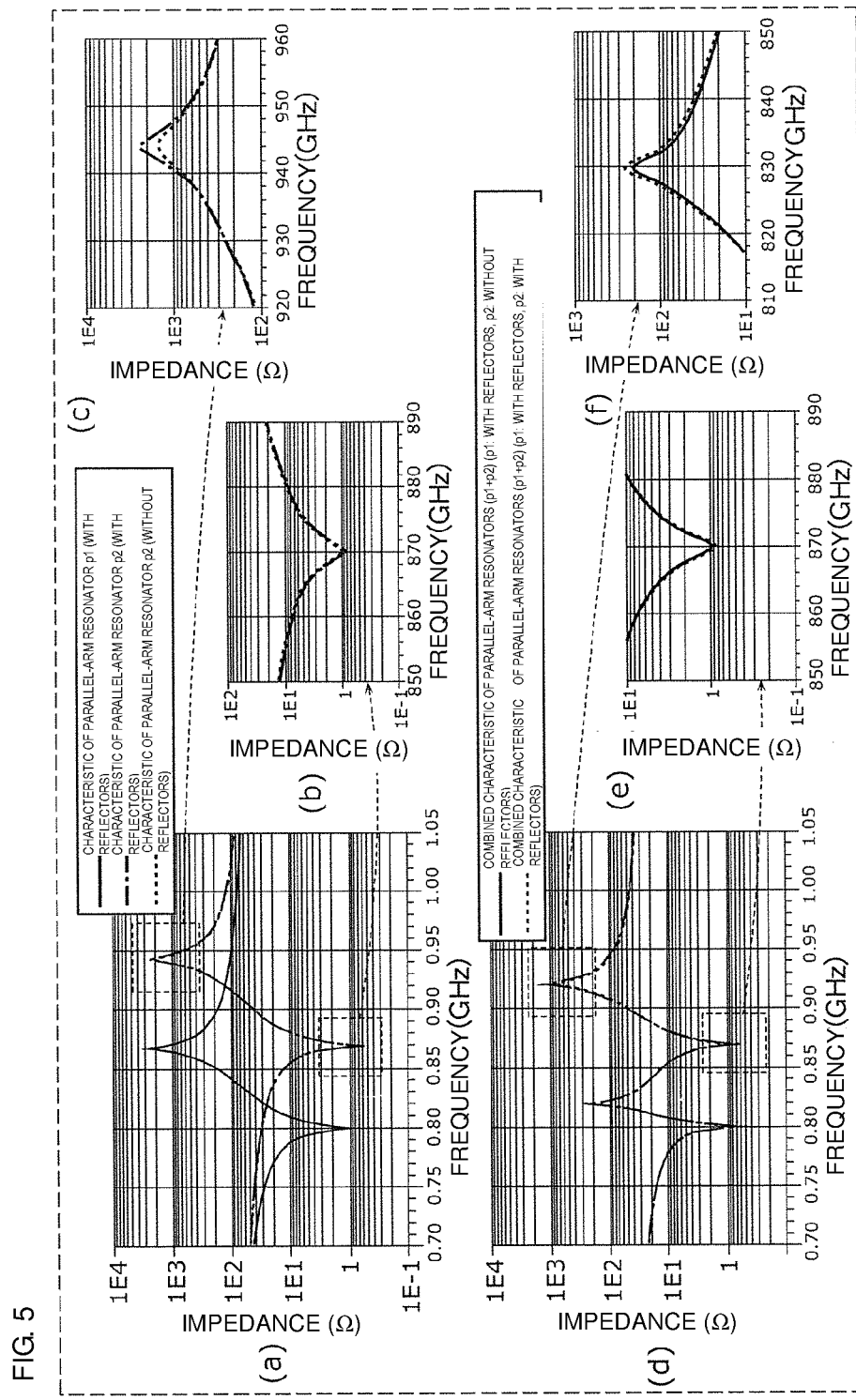
FIG. 5 illustrates graphs depicting impedance characteristics when a resonator according to the Preferred Embodiment 1 of the present invention includes reflectors and when the resonator includes no reflector.

FIG. 5 illustrates graphs depicting impedance characteristics when a resonator according to the Preferred Embodiment 1 includes reflectors and when the resonator includes no reflector. In FIG. 5, part (a) is a graph depicting impedance characteristics of the parallel-arm resonator p1 including reflectors, the parallel-arm resonator p2 including reflectors, and the parallel-arm resonator p2 including no reflector, part (b) is a graph depicting the impedance characteristic of the parallel-arm resonator p2 around the resonant frequency illustrated in part (a), and (c) is a graph depicting an enlarged view of the impedance characteristic of the parallel-arm resonator p2 around the anti-resonant frequency illustrated in part (a). In FIG. 5, part (d) is a graph depicting the combined impedance characteristic (combined characteristic) of the parallel-arm resonator p1 including reflectors and the parallel-arm resonator p2 including no reflector, and the combined impedance characteristic (combined characteristic) of the parallel-arm resonators p1 and p2 both including reflectors, part (e) is a graph depicting an enlarged view of the impedance characteristics around the higher resonant frequency illustrated in part (d), and part (f) is a graph depicting an enlarged view of the impedance characteristics around the higher anti-resonant frequency illustrated in part (d).

As illustrated in parts (a) to (c) of FIG. 5, it is discovered that when the parallel-arm resonator p2 does not include a reflector, compared with when the parallel-arm resonator p2 includes reflectors, the Q at the anti-resonant frequency is decreased, whereas the Q at the resonant frequency is not significantly decreased. Further, as illustrated in parts (d) to (f) of FIG. 5, it is discovered that when the parallel-arm resonator p2 does not include a reflector, compared with when the parallel-arm resonator p2 includes reflectors, the Q at the higher anti-resonant frequency (corresponding to the anti-resonant frequency of the parallel-arm resonator p2) in the combined impedance characteristic (combined characteristic) of the parallel-arm resonators p1 and p2 is decreased, whereas the Q at the higher resonant frequency (corresponding to the resonant frequency of the parallel-arm resonator p2) is not significantly decreased.

Next, advantageous effects achieved by the filter 10 according to the present preferred embodiment will be described with reference to an Example in comparison with a Comparative Example.

A filter of the Example has a configuration similar to that of the filter 10 according to the preferred embodiment described above. In contrast, a filter of the Comparative Example has substantially the same configuration as that of the filter of the Example, except that the parallel-arm resonator p2 includes reflectors.

Table 2 shows design parameters related to the number of electrode fingers of a reflector in the filters of the Example and the Comparative Example.

TABLE 2

| | Number of Electrode Fingers of Resonator | | |
| --- | --- | --- | --- |
| | Series-Arm Resonator s1 | Parallel-Arm Resonator p1 | Parallel-Arm Resonators p2 |
| Example | 10 | 10 | 0 (No resonator) |
| Comparative Example | 10 | 10 | 10 |

As shown in Table 2, each of the series-arm resonator s1 and the parallel-arm resonators p1 and p2 of the Comparative Example includes reflectors each including ten electrode fingers. Each of the series-arm resonator s1 and the parallel-arm resonator p1 of the Example includes reflectors each including ten electrode fingers, and the parallel-arm resonator p2 of the Example does not include a reflector. While each of the reflectors of the series-arm resonator s1 and the parallel-arm resonator p1 of the Example includes ten electrode fingers, four electrode fingers are schematically illustrated in FIG. 1B.

Figure 6:
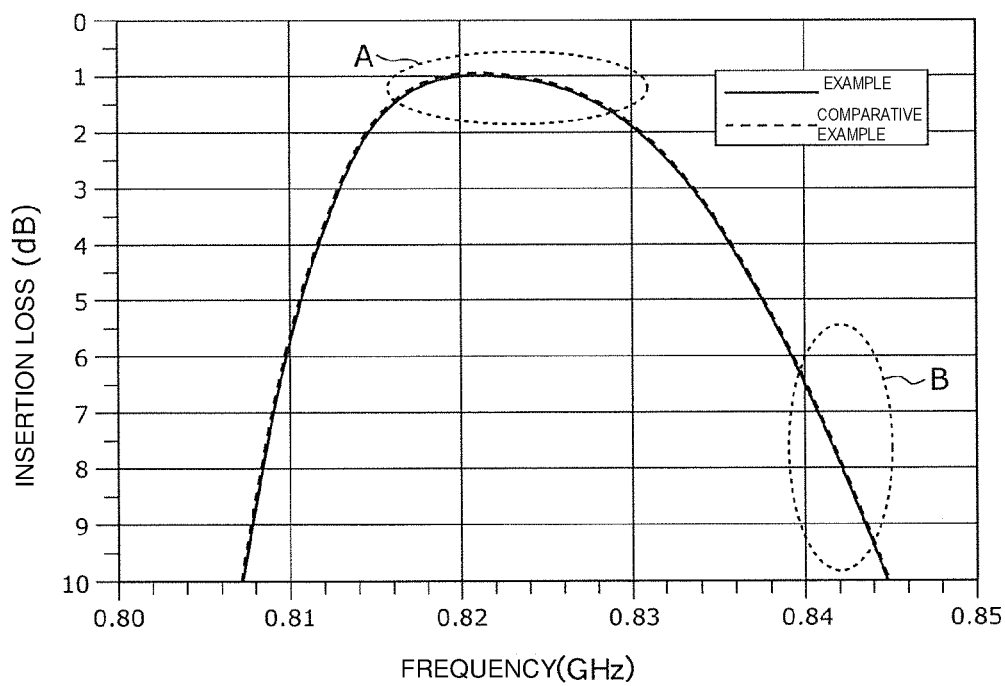
FIG. 6 is a graph depicting filter characteristics of filters of an Example of a preferred embodiment of the present invention and a Comparative Example.

FIG. 6 is a graph illustrating filter characteristics of filters of the Example and the Comparative Example.

For the filter characteristics illustrated in FIG. 6, focusing on the pass band (portion A in FIG. 6), the Example shows a small (substantially no) increase in loss within the pass band, compared with the Comparative Example. That is, in the Example, the increase in loss within the pass band is reduced or prevented.

For the filter characteristics illustrated in FIG. 6, furthermore, focusing on the attenuation slopes on the high-frequency side of the pass band (portion B in FIG. 6), the Example shows a small (substantially no) deterioration of the steepness of the attenuation slope, compared with the Comparative Example. That is, in the Example, the deterioration of the sharpness on the high-frequency side of the pass band is reduced or prevented.

Figure 7:
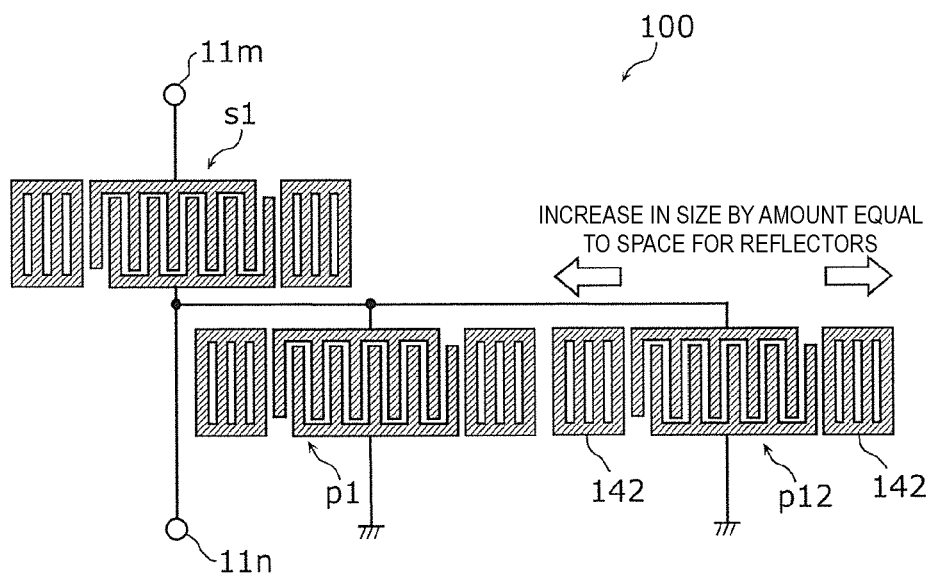
FIG. 7 is a schematic plan view of an electrode structure of the filter according to the Comparative Example.

FIG. 7 is a schematic plan view of an electrode structure of a filter 100 according to the Comparative Example. While each of the reflectors of the series-arm resonator s1 and the parallel-arm resonators p1 and p12 of the Comparative Example includes ten electrode fingers, four electrode fingers are schematically illustrated in FIG. 7. As illustrated in FIG. 6, there is no large difference in filter characteristic between the Example and the Comparative Example. However, the filter 100 of the Comparative Example illustrated in FIG. 7 includes reflectors 142 and is thus larger in size than the filter 10 of the Example illustrated in FIG. 1B by an amount equal to the space required for the reflectors 142.

As described above, in the filter 10 (acoustic wave filter device) according to the present preferred embodiment, the resonant frequency of the parallel-arm resonator p2 (second parallel-arm resonator) is higher than the resonant frequency of the parallel-arm resonator p1 (first parallel-arm resonator), and the anti-resonant frequency of the parallel-arm resonator p2 is higher than the anti-resonant frequency of the parallel-arm resonator p1. In addition, the parallel-arm resonator p1 includes the IDT electrode 121 that excites an acoustic wave, and the reflectors 122 that reflect the acoustic wave excited by the IDT electrode 121, and the parallel-arm resonator p2 includes the IDT electrode 131 that excites an acoustic wave, and does not include a reflector. As a result of intensive research, the inventor of preferred embodiments of the present invention has made the following discoveries. For impedance characteristics of a resonator alone, there is a large difference in Q at the anti-resonant frequency, but there is no large difference in Q at the resonant frequency when the resonator includes reflectors and when the resonator includes no reflector. For filter characteristics, the higher the Q at the resonant frequency of the parallel-arm resonator p2 and the higher the Q at the anti-resonant frequency of the parallel-arm resonator p1, the more the increase in loss within the pass band and the deterioration of the sharpness on the high-frequency side of the pass band is able to be reduced or prevented. Thus, for the parallel-arm resonator p1, which includes the reflectors 122, the Q at the resonant frequency is designed to have a high value, and, for the parallel-arm resonator p2, the deterioration of the Q at the resonant frequency is small even when it does not include a reflector. This reduces or prevents the increase in loss within the pass band and deterioration of the sharpness on the high-frequency side of the pass band. In addition, since the parallel-arm resonator p2 does not include a reflector, the size of the filter 10 (acoustic wave filter device) is able to be reduced by an amount corresponding to the space required for the reflectors. Accordingly, the size of an acoustic wave filter device is able to be reduced with a reduced or prevented increase in loss within the pass band and reduced or prevented deterioration of the sharpness on the high-frequency side of the pass band.

In the preferred embodiment described above, the parallel-arm resonators p1 and p2 are connected in parallel and are connected to the same node x1 (node) on a series arm. However, the parallel-arm resonators p1 and p2 may be connected in series with each other and may be connected to the same node x1 (node) on a series arm. Accordingly, such a filter according to a modification of Preferred Embodiment 1 will be described.

Figure 8A:
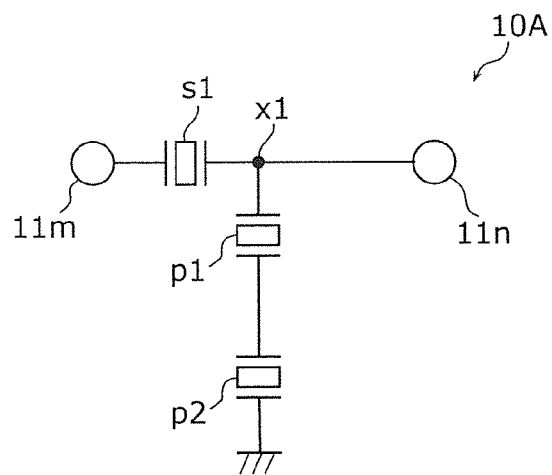
FIG. 8A is a circuit configuration diagram of a filter according to a modification of the Preferred Embodiment 1 of the present invention.
Figure 8B:
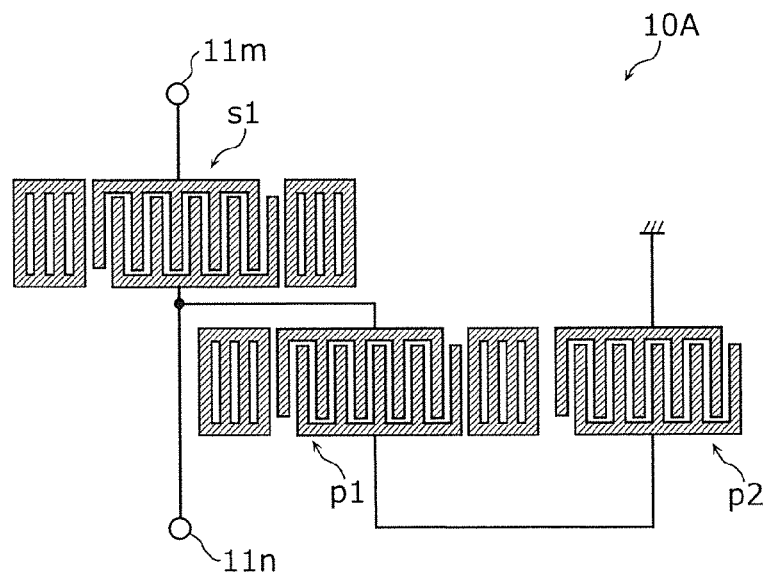
FIG. 8B is a schematic plan view of an electrode structure of the filter according to the modification of the Preferred Embodiment 1 of the present invention.

FIG. 8A is a circuit configuration diagram of a filter 10A according to a modification of the Preferred Embodiment 1. FIG. 8B is a schematic plan view of an electrode structure of the filter 10A according to the modification of the Preferred Embodiment 1.

In the filter 10A illustrated in FIGS. 8A and 8B, unlike the filter 10 illustrated in FIGS. 1A and 1B, the parallel-arm resonators p1 and p2 are connected between ground and the same node x1 on a path connecting the input/output terminal 11m (first input/output terminal) and the input/output terminal 11n (second input/output terminal) so as to be connected in series with each other. In the present modification, the parallel-arm resonator p1 includes a terminal connected to the node x1 and another terminal connected to one terminal of the parallel-arm resonator p2. The parallel-arm resonator p2 includes a terminal connected to the other terminal of the parallel-arm resonator p1 and another terminal connected to ground. The order in which the parallel-arm resonators p1 and p2 are connected is not limited to that described above and may be reverse.

Figure 9:
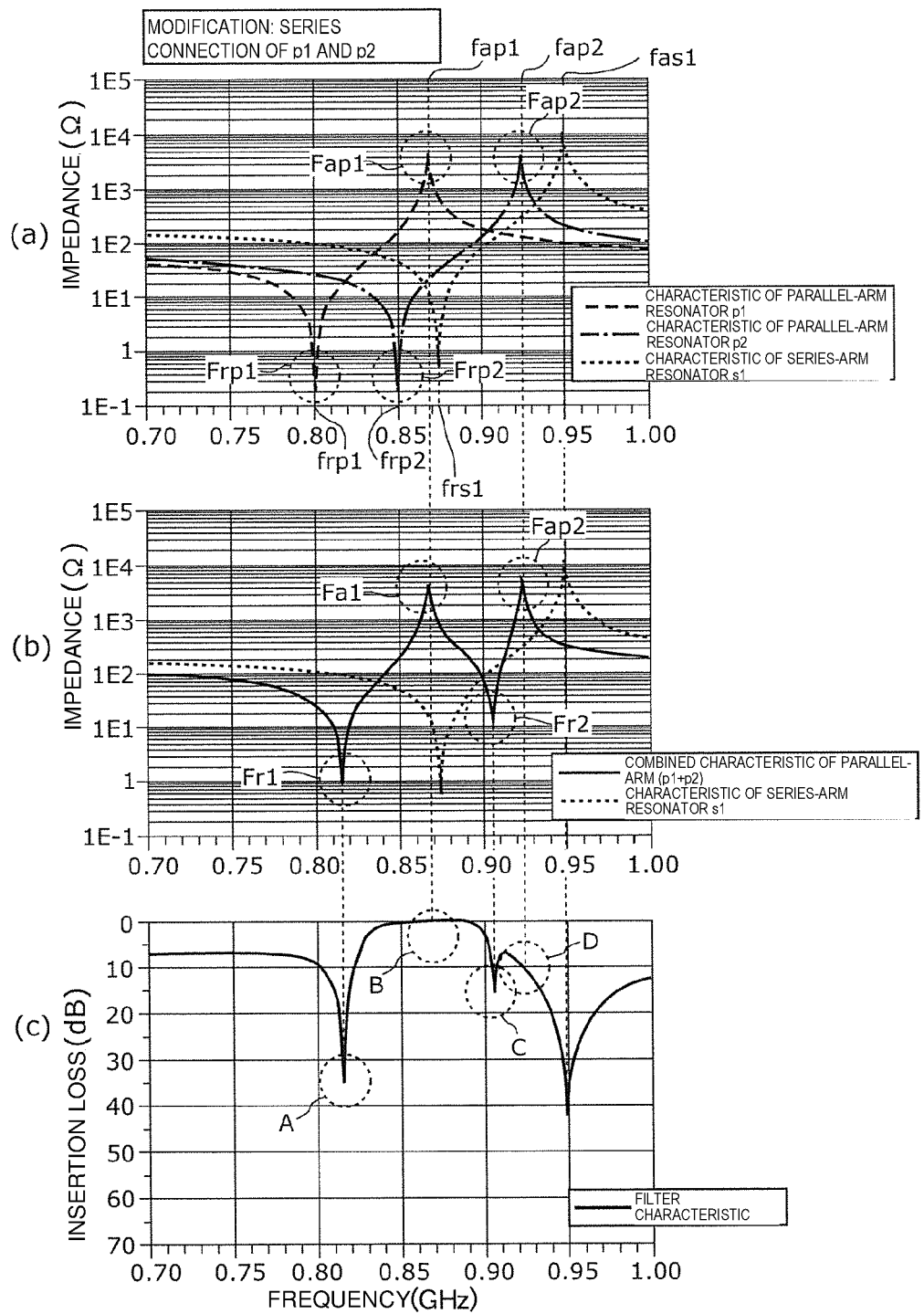
FIG. 9 illustrates graphs depicting characteristics of the filter according to the modification of the Preferred Embodiment 1 of the present invention.

FIG. 9 illustrates graphs depicting characteristics of the filter 10A according to the modification of the Preferred Embodiment 1.

Also for the characteristics of the filter 10A according to the present modification, as for the characteristics of the filter 10 according to the Preferred Embodiment 1, the Q at the anti-resonant frequency (Fap1 in FIG. 9) of the parallel-arm resonator p1 and the Q at the resonant frequency (Frp2 in FIG. 9) of the parallel-arm resonator p2 affect the sharpness on the high-frequency side of the pass band. In addition, the Q at the anti-resonant frequency (Fap2 in FIG. 9) of the parallel-arm resonator p2 is less likely to affect the pass band and attenuation band of the filter 10A. A specific mechanism for this is similar to that in the Preferred Embodiment 1 and thus will not be described in detail herein.

Accordingly, even with the filter 10A according to the present modification, in which the parallel-arm resonator p2 does not include a reflector, as in the Preferred Embodiment 1, the size of an acoustic wave filter device is able to be reduced with a reduced or prevented increase in loss within the pass band and reduced or prevented deterioration of the sharpness on the high-frequency side of the pass band.

Preferred Embodiment 2

The configurations of the filters (acoustic wave filter devices) according to the Preferred Embodiment 1 and the modifications thereof are applicable to a tunable filter whose pass band is variable. Accordingly, such a tunable filter according to a Preferred Embodiment 2 of the present invention will be described with reference to Application Examples 1 to 5. Specifically, Application Examples 1 to 4 are application examples of the filter 10 according to the Preferred Embodiment 1 to a tunable filter, and Application Example 5 is an application example of the filter 10A according to the modification of the Preferred Embodiment 1 to a tunable filter.

The tunable filters in Application Examples 1 to 5 described below each include a switch element connected in series with or parallel to the parallel-arm resonator p1 or the parallel-arm resonator p2, and each have a pass band switched in accordance with the connection (ON) or disconnection (OFF) of the switch element. The switch element is turned on or off in accordance with a control signal from a controller, such as an RF signal processing circuit (RFIC: Radio Frequency Integrated Circuit), for example.

Application Example 1

Figure 10A:
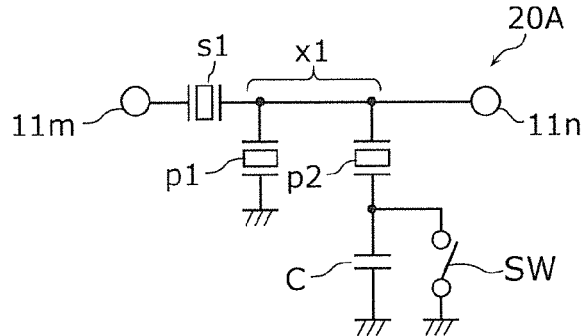
FIG. 10A is a circuit configuration diagram of a filter in an Application Example 1 of a Preferred Embodiment 2 of the present invention.

FIG. 10A is a circuit configuration diagram of a filter 20A in an Application Example 1 of the Preferred Embodiment 2.

Unlike the filter 10 illustrated in FIG. 1A, the filter 20A illustrated in FIG. 10A further includes a capacitor C and a switch SW that are connected in parallel and that are connected in series with at least one of the parallel-arm resonators p1 and p2 (first parallel-arm resonator and second parallel-arm resonator) (in the present application example, the parallel-arm resonator p2). This configuration enables the filter 20A to switch between a first bandpass characteristic and a second bandpass characteristic in accordance with the connection or disconnection of the switch SW. Specifically, in the present application example, the capacitor C and the switch SW, which are connected in parallel, are connected in series with only the parallel-arm resonator p2 out of the parallel-arm resonators p1 and p2.

That is, in the present application example, a circuit in which the capacitor C and the switch SW are connected in parallel is connected in series with the parallel-arm resonator p2 between the node x1 and ground, and, specifically, is connected in series between ground and the parallel-arm resonator p2. The capacitor C and the switch SW may be connected between the node x1 and the parallel-arm resonator p2.

In the present preferred embodiment, the capacitor C is an impedance element connected in series with the parallel-arm resonator p2. The frequency variable width of the pass band of the filter 20A depends on the constant of the capacitor C. For example, the frequency variable width increases as the constant of the capacitor C decreases. Thus, the constant of the capacitor C may be determined, as desired, in accordance with the frequency specifications required for the filter 20A. Further, the capacitor C may preferably be a variable capacitor such as, for example, a varicap or a DTC (Digital Tunable Capacitor). Accordingly, the frequency variable width is able to be finely adjusted.

The switch SW is preferably, for example, an SPST (Single Pole Single Throw) switch element including a terminal connected to a connection node between the parallel-arm resonator p2 and the capacitor C and another terminal connected to ground. The switch SW is switched between connection (ON) and disconnection (OFF) in accordance with a control signal from the controller (not illustrated), thus establishing connection or disconnection between the connection node and ground.

Examples of the switch SW include a GaAs or CMOS (Complementary Metal Oxide Semiconductor) FET (Field Effect Transistor) switch and a diode switch, for example. Accordingly, the switch SW may be defined by a single FET switch or diode switch, and thus the filter 20A is able to be reduced in size.

The parallel-arm resonators p1 and p2, the capacitor C, and the switch SW define a parallel-arm resonant circuit connected between ground and the node x1 on the path (on the series arm) connecting the input/output terminal 11m and the input/output terminal 11n. That is, the parallel-arm resonant circuit is disposed in a single parallel arm connecting the series arm and ground. Thus, the filter 20A has a single-stage ladder filter structure including the series-arm resonator s1 and the parallel-arm resonant circuit.

In the parallel-arm resonant circuit, both of the frequency at which the impedance reaches a local minimum and the frequency at which the impedance reaches a local maximum are shifted to lower ranges or higher ranges in accordance with the ON (connection) or OFF (disconnection) of the switch SW. This will be described below together with the characteristics of the filter 20A.

Figure 10B:
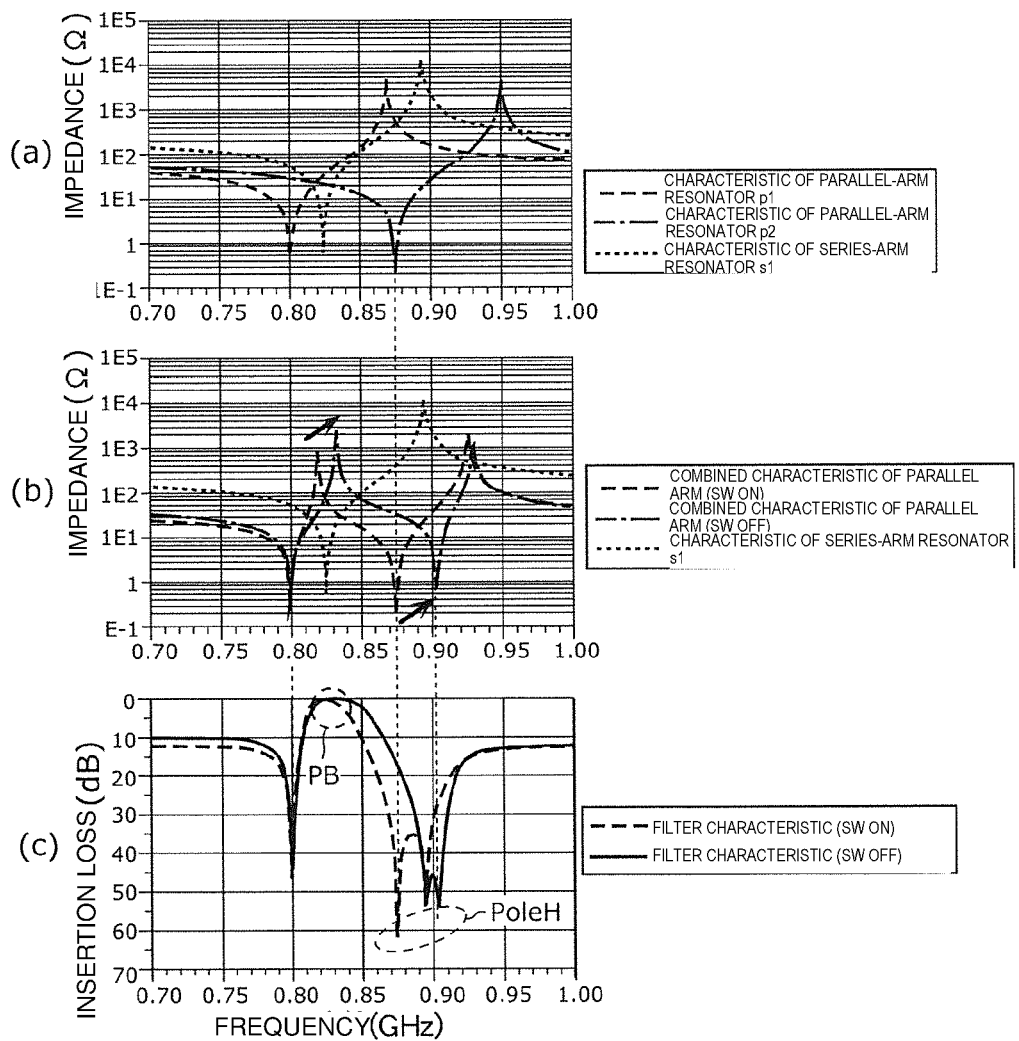
FIG. 10B illustrates graphs depicting characteristics of the filter in the Application Example 1 of the Preferred Embodiment 2 of the present invention.

FIG. 10B illustrates graphs depicting characteristics of the filter 20A in the Application Example 1 of the Preferred Embodiment 2. Specifically, part (a) of FIG. 10B is a graph depicting the impedance characteristics of resonators alone (the parallel-arm resonators p1 and p2 and the series-arm resonator s1). Part (b) of FIG. 10B is a graph depicting a comparison of the combined impedance characteristics (combined characteristics) of a parallel-arm resonant circuit (in the present application example, a circuit including the parallel-arm resonators p1 and p2, the capacitor C, and the switch SW) during on/off periods of the switch SW. In FIG. 10B, the impedance characteristic of the series-arm resonator s1 is also illustrated. Part (c) of FIG. 10B is a graph depicting a comparison of filter characteristics during on/off periods of the switch SW.

The impedance characteristics of resonators (the parallel-arm resonator p1, the parallel-arm resonator p2, and the series-arm resonator s1) alone and the characteristic during the on period of the switch SW are similar to those in the Preferred Embodiment 1 described above. Thus, these will be described in a simplified manner, as appropriate, hereinafter.

That is, when the switch SW is on, the filter 20A has a first bandpass characteristic in which a pass band is defined by the lower anti-resonant frequency among the two anti-resonant frequencies of the parallel-arm resonant circuit and by the resonant frequency frs1 of the series-arm resonator s1, a pole (attenuation pole) on the low-frequency side of the pass band is defined by the resonant frequency frp1 of the parallel-arm resonator p1, and a pole (attenuation pole) on the high-frequency side of the pass band is defined by the resonant frequency frp2 of the parallel-arm resonator p2 and the anti-resonant frequency fas1 of the series-arm resonator s1.

When the switch SW is off, on the other hand, the impedance characteristic of the parallel-arm resonant circuit is a characteristic that is affected by the capacitor C. That is, in this state, the combined characteristic of the two parallel-arm resonators (the parallel-arm resonators p1 and p2) and the capacitor C corresponds to the impedance characteristic of the parallel-arm resonant circuit.

In the present application example, the capacitor C is only added to the parallel-arm resonator p2 during the off period of the switch SW. Thus, as indicated by solid black arrows in part (b) of FIG. 10B, when the switch SW is switched from on to off, in the impedance characteristic of the parallel-arm resonant circuit ("combined characteristic of parallel arm" in FIG. 10B), the higher resonant frequency out of the two resonant frequencies and the lower anti-resonant frequency of the two anti-resonant frequencies are both shifted to higher ranges.

The lower anti-resonant frequency and the higher resonant frequency of the parallel-arm resonant circuit define an attenuation slope on the high-frequency side of the pass band of the filter 20A. Accordingly, as illustrated in part (c) of FIG. 10B, the switch SW is switched from on to off, thus switching the bandpass characteristic of the filter 20A from the first bandpass characteristic to a second bandpass characteristic in which the attenuation slope on the high-frequency side of the pass band is shifted to a higher range with its steepness maintained. In other words, the filter 20A is able to switch the attenuation pole frequency on the high-frequency side of the pass band in accordance with switching between the connection and disconnection of the switch SW, and is able to reduce or prevent the increase in insertion loss at the high-frequency end of the pass band.

Even with the filter 20A having the configuration described above, in which the parallel-arm resonator p2 does not include a reflector, as in the Preferred Embodiment 1, for each of the first bandpass characteristic and the second bandpass characteristic, the size of the acoustic wave filter device is able to be reduced with a reduced or prevented increase in loss and reduced or prevented deterioration of the sharpness on the high-frequency side of the pass band. That is, the filter 20A defines a tunable filter in which the size of an acoustic wave filter device is able to be reduced with a reduced or prevented increase in loss and reduced or prevented deterioration of the sharpness on the high-frequency side of the pass band.

The impedance element is not limited to a capacitor and may be an inductor, for example. When an inductor is used as an impedance element, the direction in which an attenuation slope is shifted in response to the on/off of the switch SW is different than that in the configuration described above. Specifically, in the second bandpass characteristic during the off period of the switch SW, an attenuation slope is shifted to a lower range, compared with the first bandpass characteristic during the on period of the switch SW. At this time, the frequency variable width of the pass band of the filter 20A depends on the constant of the inductor. For example, the frequency variable width increases as the constant of the inductor increases. Thus, the constant of the inductor may be determined, as desired, in accordance with the frequency specifications required for the filter 20A. In this case, the inductor may preferably be a MEMS (Micro Electro Mechanical Systems) variable inductor, for example. Accordingly, the frequency variable width is able to be finely adjusted.

Application Example 2

Figure 11A:
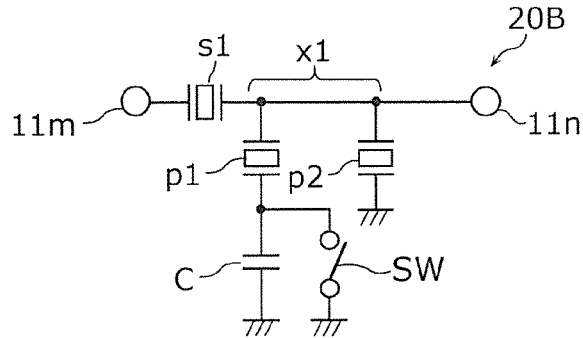
FIG. 11A is a circuit configuration diagram of a filter in an Application Example 2 of the Preferred Embodiment 2 of the present invention.

FIG. 11A is a circuit configuration diagram of a filter 20B in an Application Example 2 of the Preferred Embodiment 2.

In the filter 20B illustrated in FIG. 11A, unlike the filter 20A illustrated in FIG. 10A, the capacitor C and the switch SW, which are connected in parallel, are connected in series with only the parallel-arm resonator p1 of the parallel-arm resonators p1 and p2.

Figure 11B:
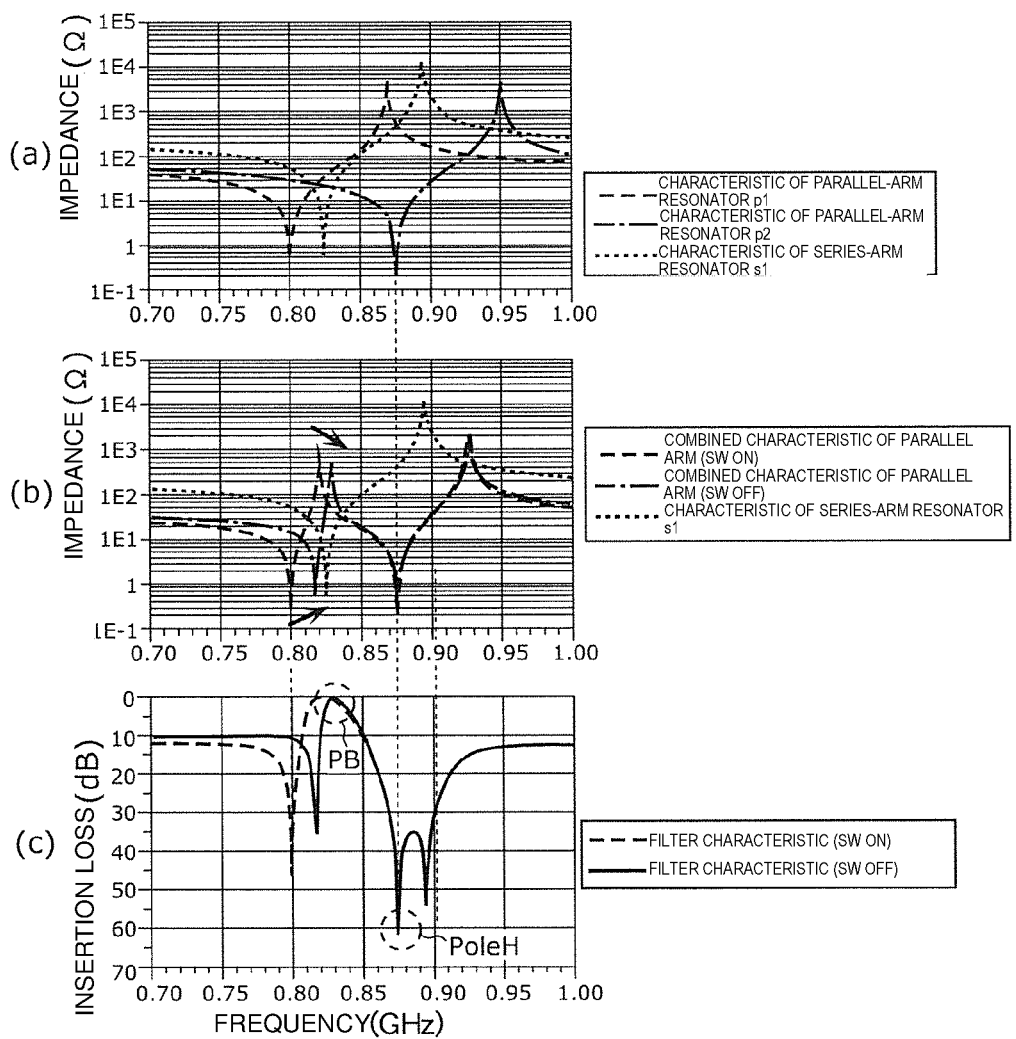
FIG. 11B illustrates graphs depicting characteristics of the filter in the Application Example 2 of the Preferred Embodiment 2 of the present invention.

FIG. 11B illustrates graphs depicting characteristics of the filter 20B in the Application Example 2 of the Preferred Embodiment 2. Specifically, as in parts (a) and (b) of FIG. 10B, parts (a) and (b) of FIG. 11B are graphs depicting the impedance characteristics of resonators alone and combined impedance characteristics of a parallel-arm resonant circuit. Part (c) of FIG. 11B is a graph depicting a comparison of filter characteristics during on/off periods of the switch SW.

In the present application example, the capacitor C is only added to the parallel-arm resonator p1 during the off period of the switch SW. Thus, as indicated by solid black arrows in part (b) of FIG. 11B, when the switch SW is switched from on to off, in the impedance characteristic of the parallel-arm resonant circuit ("combined characteristic of parallel arm" in FIG. 11B), the lower resonant frequency of the two resonant frequencies and the lower anti-resonant frequency of the two anti-resonant frequencies are both shifted to higher ranges.

The lower anti-resonant frequency and the lower resonant frequency of the parallel-arm resonant circuit define an attenuation slope on the low-frequency side of the pass band of the filter 20B. Accordingly, as illustrated in part (c) of FIG. 11B, the switch SW is switched from on to off, thus switching the bandpass characteristic of the filter 20B from the first bandpass characteristic to a second bandpass characteristic in which the attenuation slope on the low-frequency side of the pass band is shifted to a higher range with its steepness maintained. In other words, the filter 20B is able to switch the attenuation pole frequency on the low-frequency side of the pass band in accordance with switching between the connection and disconnection of the switch SW, and is able to reduce or prevent the increase in insertion loss at the low-frequency end of the pass band.

Even with the filter 20B having the configuration described above, in which the parallel-arm resonator p2 does not include a reflector, as in the Preferred Embodiment 1, for each of the first bandpass characteristic and the second bandpass characteristic, the size of the acoustic wave filter device is able to be reduced with a reduced or prevented increase in loss and reduced or prevented deterioration of the sharpness on the high-frequency side of the pass band. That is, the filter 20B defines a tunable filter in which the size of an acoustic wave filter device is able to be reduced with a reduced or prevented increase in loss and reduced or prevented deterioration of the sharpness on the high-frequency side of the pass band.

Application Example 3

Figure 12A:
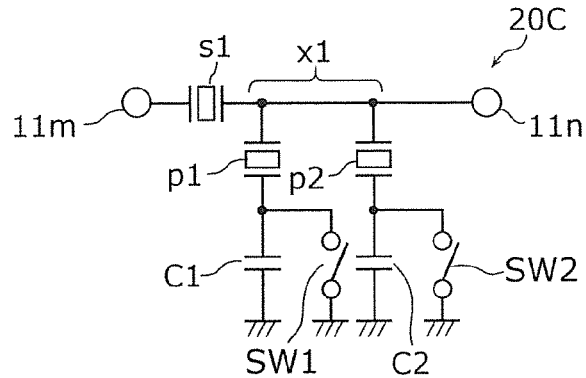
FIG. 12A is a circuit configuration diagram of a filter in an Application Example 3 of the Preferred Embodiment 2 of the present invention.

FIG. 12A is a circuit configuration diagram of a filter 20C in an Application Example 3 of the Preferred Embodiment 2.

In the filter 20C illustrated in FIG. 12A, the attenuation slopes on the high-frequency side of the pass band and the low-frequency side of the pass band are both shifted. Specifically, the filter 20C includes a capacitor C1 and a switch SW1, which correspond to the capacitor C (impedance element) and the switch SW in the pair included in the filter 20B illustrated in FIG. 11A. The filter 20C further includes a capacitor C2 and a switch SW2, which correspond to the capacitor C (impedance element) and the switch SW in the pair (another pair) included in the filter 20A illustrated in FIG. 10A.

Figure 12B:
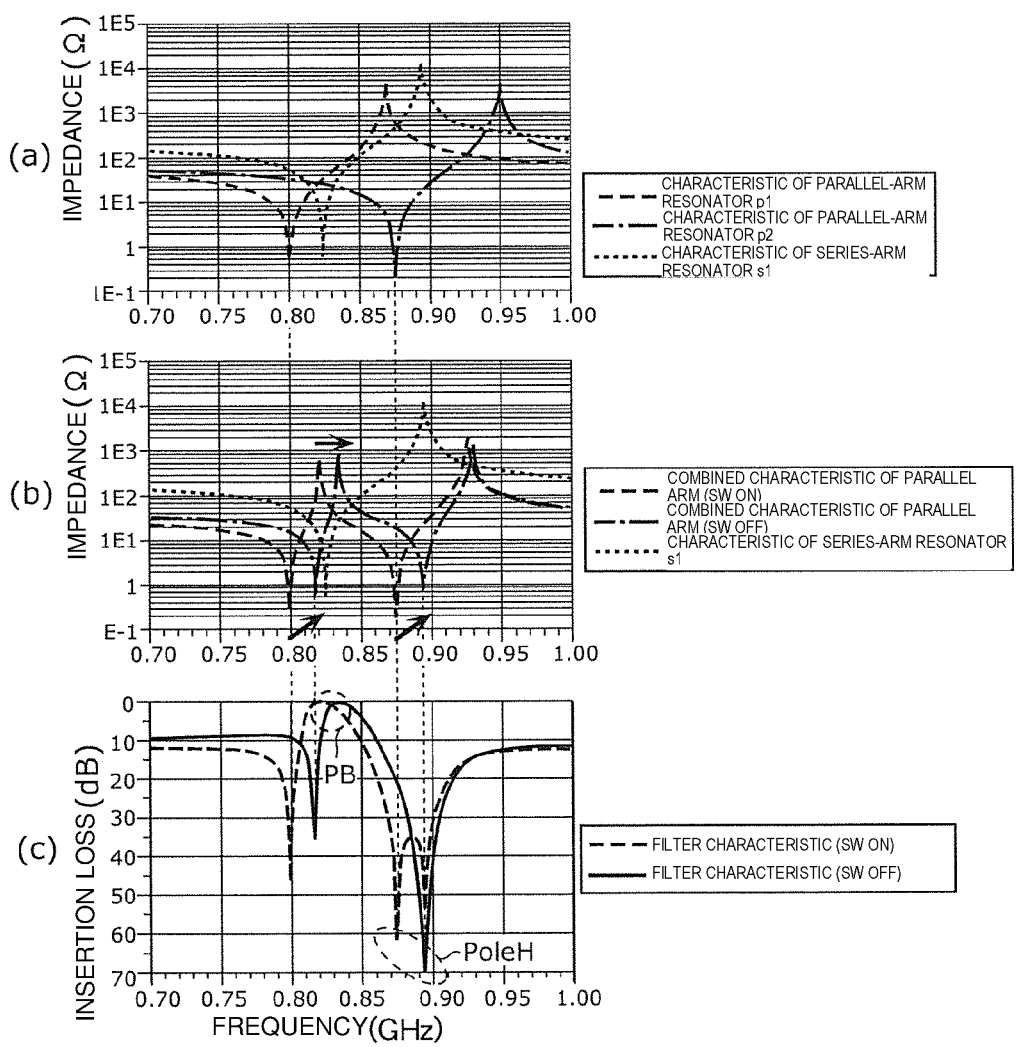
FIG. 12B illustrates graphs depicting characteristics of the filter in the Application Example 3 of the Preferred Embodiment 2 of the present invention.

FIG. 12B illustrates graphs depicting characteristics of the filter 20C in the Application Example 3 of the Preferred Embodiment 2. Specifically, as in parts (a) and (b) of FIG. 11B, parts (a) and (b) of FIG. 12B are graphs depicting the impedance characteristics of resonators alone and combined impedance characteristics of a parallel-arm resonant circuit (in the present application example, a circuit including the parallel-arm resonators p1 and p2, the capacitors C1 and C2, and the switches SW1 and SW2). Part (c) of FIG. 12B is a graph depicting a comparison of filter characteristics during on/off periods of both the switches SW1 and SW2.

In the present application example, during the off period of both of the switches SW1 and SW2, the capacitor C1 is added to the parallel-arm resonator p1 and the capacitor C2 is added to the parallel-arm resonator p2. Thus, as indicated by solid black arrows in part (b) of FIG. 12B, when the switches SW1 and SW2 are both switched from on to off, in the impedance characteristic of the parallel-arm resonant circuit ("combined characteristic of parallel arm" in FIG. 12B), both of the two resonant frequencies and the lower anti-resonant frequency of the two anti-resonant frequencies are shifted to higher ranges.

Accordingly, as illustrated in part (c) of FIG. 12B, the switches SW1 and SW2 are both switched from on to off, thus switching the bandpass characteristic of the filter 20C from the first bandpass characteristic to a second bandpass characteristic in which the attenuation slopes on the high-frequency side of the pass band and the low-frequency side of the pass band are shifted to higher ranges with their steepness maintained. In other words, the filter 20C is able to switch the attenuation pole frequencies on the high-frequency side of the pass band and the low-frequency side of the pass band in accordance with switching between the connection and disconnection of the switches SW1 and SW2, and is able to reduce or prevent the increase in insertion loss at the high-frequency end of the pass band and at the low-frequency end of the pass band. Thus, for example, the filter 20C is able to shift the center frequency while maintaining the band width.

Even with the filter 20C having the configuration described above, in which the parallel-arm resonator p2 does not include a reflector, as in the Preferred Embodiment 1, for each of the first bandpass characteristic and the second bandpass characteristic, the size of the acoustic wave filter device is able to be reduced with a reduced or prevented increase in loss and reduced or prevented deterioration of the sharpness on the high-frequency side of the pass band. That is, the filter 20C defines a tunable filter in which the size of an acoustic wave filter device is able to be reduced with a reduced or prevented increase in loss and reduced or prevented deterioration of the sharpness on the high-frequency side of the pass band.

The filter 20C may not necessarily turn on/off the switches SW1 and SW2 together, and may turn on/off the switches SW1 and SW2 separately. However, turning on/off the switches SW1 and SW2 together reduces the number of control lines to controlling the switches SW1 and SW2, thus achieving a simplified configuration of the filter 20C.

In contrast, turning on/off the switches SW1 and SW2 separately provide more variations in the pass band that are able to be switched by the filter 20C.

Specifically, as described for the filter 20A, the high-frequency end of the pass band is able to be varied in accordance with the on and off of the switch SW2 connected in series with the parallel-arm resonator p2. Further, as described for the filter 20B, the low-frequency end of the pass band is able to be varied in accordance with the on and off of the switch SW1 connected in series with the parallel-arm resonator p1.

Thus, turning on or off both of the switches SW1 and SW2 shifts the low-frequency end and the high-frequency end of the pass band to lower ranges or higher ranges. That is, the center frequency of the pass band is able to be shifted to a lower range or a higher range. In addition, switching one of the switches SW1 and SW2 from on to off and the other switch from off to on shifts both the low-frequency end and the high-frequency end of the pass band so as to increase or reduce the frequency difference. That is, the width of the pass band is able to be varied with the center frequency of the pass band maintained substantially constant. Additionally, while keeping one of the switches SW1 and SW2 in the on or off state, turning on and off the other switch shifts, with one of the low-frequency end and the high-frequency end of the pass band fixed, the other frequency end to a lower range or a higher range. That is, the low-frequency end or the high-frequency end of the pass band is able to be changed.

Accordingly, the use of the capacitors C1 and C2 and the switches SW1 and SW2 improves the flexibility of changing the pass band.

Application Example 4

Figure 13A:
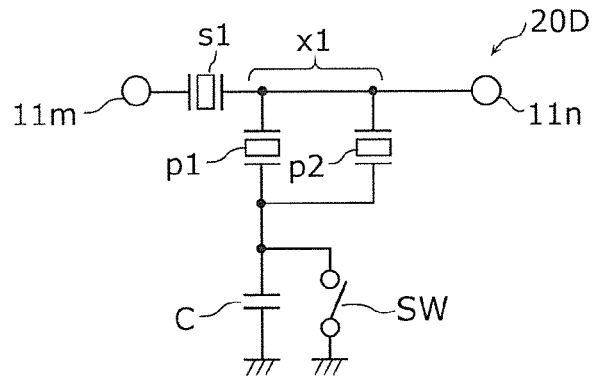
FIG. 13A is a circuit configuration diagram of a filter in an Application Example 4 of the Preferred Embodiment 2 of the present invention.

FIG. 13A is a circuit configuration diagram of a filter 20D in an Application Example 4 of the Preferred Embodiment 2.

In the filter 20D illustrated in FIG. 13A, unlike the filter 20A illustrated in FIG. 10A, the capacitor C and the switch SW, which are connected in parallel, are connected in series with a circuit in which the parallel-arm resonator p1 and the parallel-arm resonator p2 are connected in parallel.

Figure 13B:
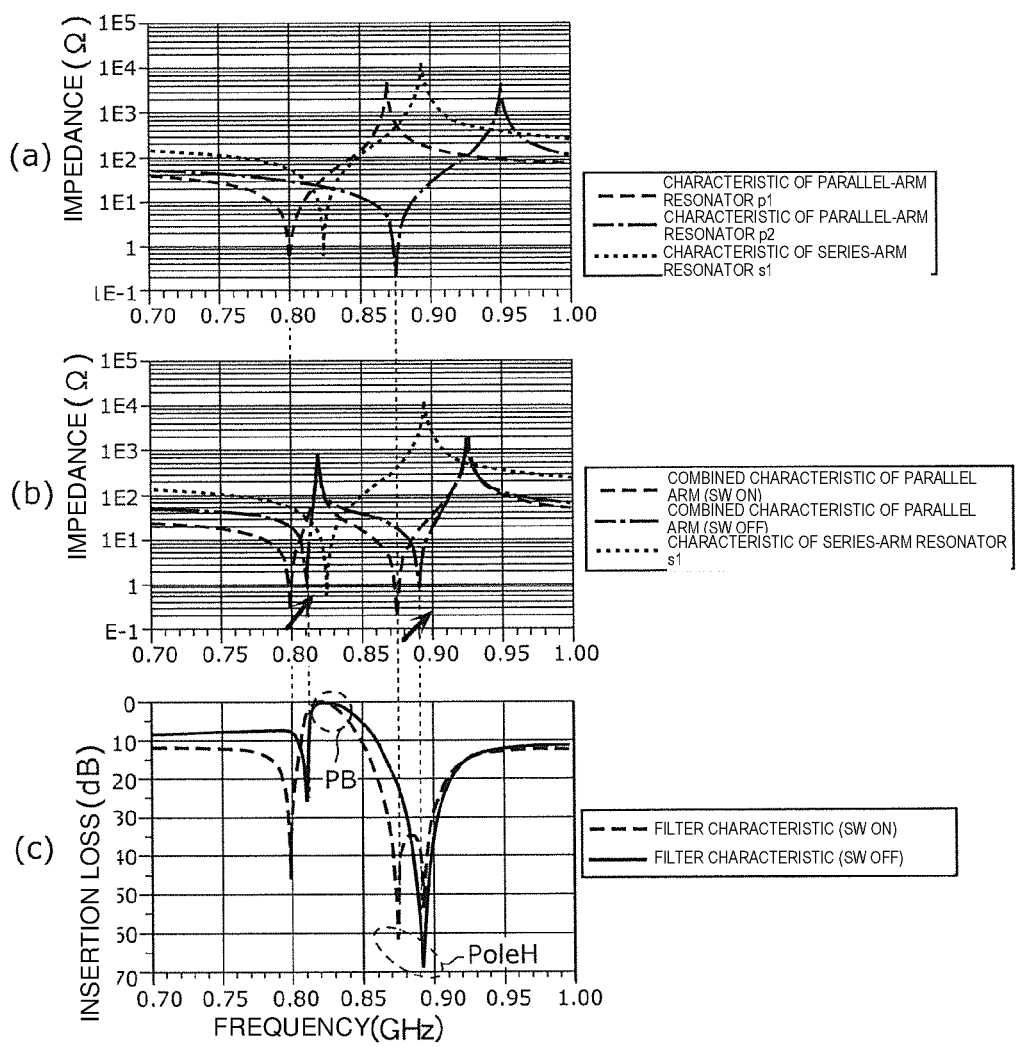
FIG. 13B illustrates graphs depicting characteristics of the filter in the Application Example 4 of the Preferred Embodiment 2 of the present invention.

FIG. 13B illustrates graphs depicting characteristics of the filter 20D in the Application Example 4 of the Preferred Embodiment 2. Specifically, as in parts (a) and (b) of FIG. 11B, parts (a) and (b) of FIG. 13B are graphs depicting the impedance characteristics of resonators alone and combined impedance characteristics of a parallel-arm resonant circuit. Part (c) of FIG. 13B is a graph depicting a comparison of filter characteristics during on/off periods of the switch SW.

In the present application example, during the off period of the switch SW, the capacitor C is added to the parallel-arm resonators p1 and p2, which are connected in parallel. Thus, as indicated by solid black arrows in part (b) of FIG. 13B, when the switch SW is switched from on to off, in the impedance characteristic of the parallel-arm resonant circuit ("combined characteristic of parallel arm" in FIG. 13B), none of the two anti-resonant frequencies are shifted, whereas both of the two resonant frequencies are shifted to higher ranges.

Accordingly, as illustrated in part (c) of FIG. 13B, the switch SW is switched from on to off, thus switching the bandpass characteristic of the filter 20D from the first bandpass characteristic to a second bandpass characteristic in which both the poles (attenuation poles) on both sides of the pass band are shifted to higher ranges.

Even with the filter 20D having the configuration described above, in which the parallel-arm resonator p2 does not include a reflector, as in the Preferred Embodiment 1, for each of the first bandpass characteristic and the second bandpass characteristic, the size of the acoustic wave filter device is able to be reduced with a reduced or prevented increase in loss and reduced or prevented deterioration of the sharpness on the high-frequency side of the pass band. That is, the filter 20D defines a tunable filter in which the size of an acoustic wave filter device is able to be reduced with a reduced or prevented increase in loss and reduced or prevented deterioration of the sharpness on the high-frequency side of the pass band.

Application Example 5

Figure 14A:
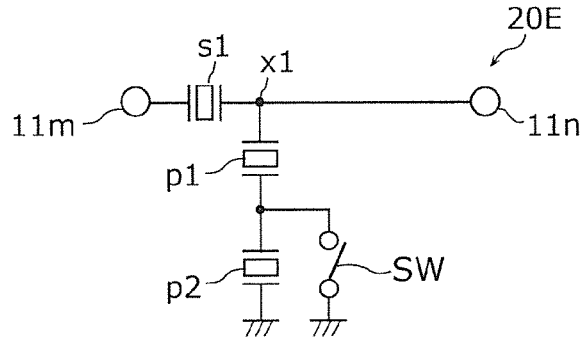
FIG. 14A is a circuit configuration diagram of a filter in an Application Example 5 of the Preferred Embodiment 2 of the present invention.

FIG. 14A is a circuit configuration diagram of a filter 20E in an Application Example 5 of the Preferred Embodiment 2.

Unlike the filter 10A illustrated in FIG. 8A, the filter 20E illustrated in FIG. 14A further includes a switch SW connected in parallel to one of the parallel-arm resonators p1 and p2 (first parallel-arm resonator and second parallel-arm resonator). In the present application example, the switch SW is connected in parallel to the parallel-arm resonator p2. If the specifications required for the filter 20E permit, for example, the effect of the diffraction loss of the parallel-arm resonator p2, the switch SW may be connected in parallel to the parallel-arm resonator p1.

Figure 14B:
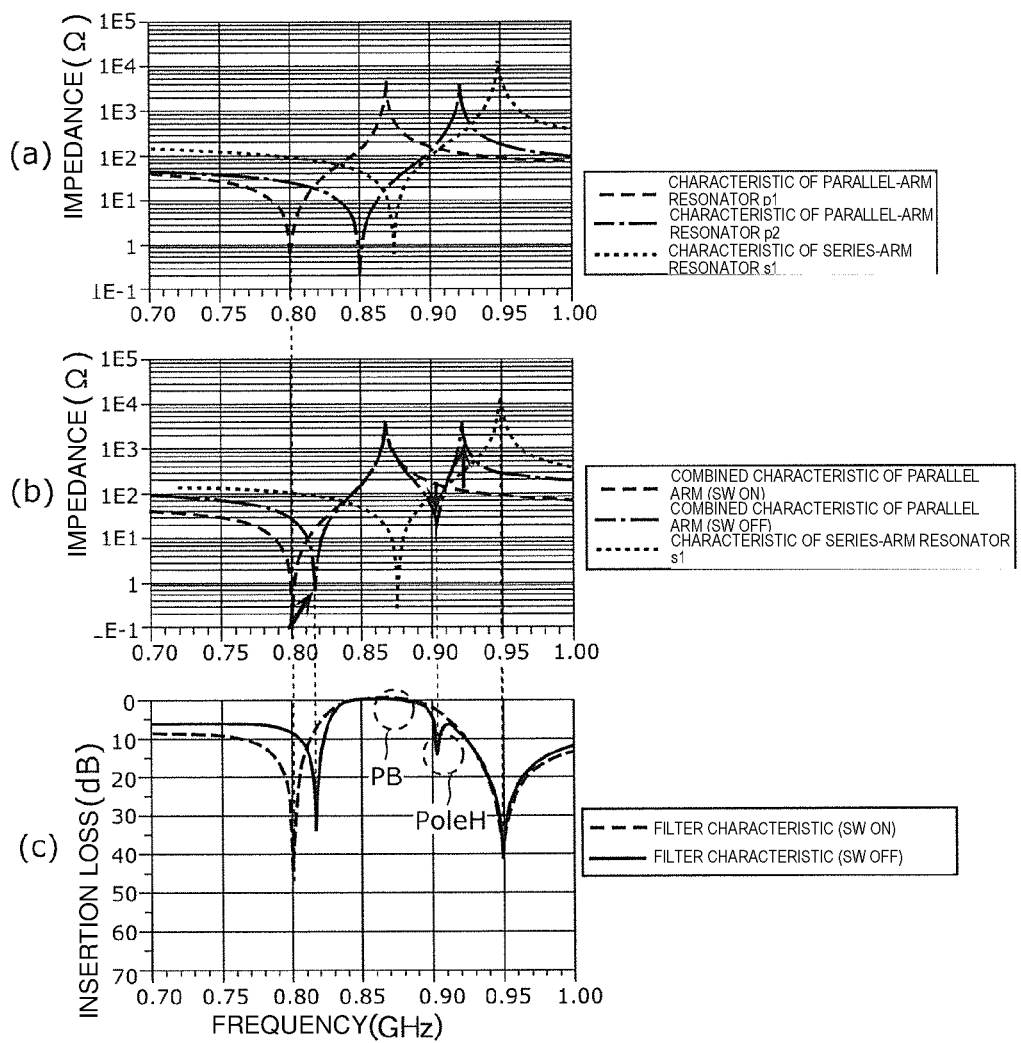
FIG. 14B illustrates graphs depicting characteristics of the filter in the Application Example 5 of the Preferred Embodiment 2 of the present invention.

FIG. 14B illustrates graphs depicting characteristics of the filter 20E in the Application Example 5 of the Preferred Embodiment 2. Specifically, as in parts (a) and (b) of FIG. 10B, parts (a) and (b) of FIG. 14B are graphs depicting the impedance characteristics of resonators alone and combined impedance characteristics of a parallel-arm resonant circuit (in the present application example, a circuit including the parallel-arm resonators p1 and p2 and the switch SW). Part (c) of FIG. 14B is a graph depicting a comparison of filter characteristics during on/off periods of the switch SW.

In the present application example, during the on period of the switch SW, the impedance characteristic of the parallel-arm resonant circuit ("combined characteristic of parallel arm" in FIG. 14B) corresponds to the impedance characteristic of the parallel-arm resonator p1 alone. During the off period of the switch SW, on the other hand, the parallel-arm resonator p2 is added to the parallel-arm resonator p1. Thus, as indicated by solid black arrows in part (b) of FIG. 14B, when the switch SW is switched from on to off, the impedance characteristic of the parallel-arm resonant circuit ("combined characteristic of parallel arm" in FIG. 14B) corresponds to the combined impedance characteristic of a series-connected circuit of the parallel-arm resonators p1 and p2.

Accordingly, as illustrated in part (c) of FIG. 14B, the switch SW is switched from on to off, thus shifting, in the bandpass characteristic of the filter 20E, the attenuation pole on the low-frequency side of the pass band to a higher range. Additionally, as indicated by PoleH in part (c) of FIG. 14B, an additional attenuation pole is generated on the high-frequency side of the pass band. Thus, attenuation on the high-frequency side of the pass band is also able to be obtained.

Even with the filter 20E having the configuration described above, in which the parallel-arm resonator p2 does not include a reflector, as in the Preferred Embodiment 1, for each of the first bandpass characteristic and the second bandpass characteristic, the size of the acoustic wave filter device is able to be reduced with a reduced or prevented increase in loss and reduced or prevented deterioration of the sharpness on the high-frequency side of the pass band. That is, the filter 20E defines a tunable filter in which the size of an acoustic wave filter device is able to be reduced with a reduced or prevented increase in loss and reduced or prevented deterioration of the sharpness on the high-frequency side of the pass band.

Preferred Embodiment 3

The filters (acoustic wave filter devices) provided in the Preferred Embodiments 1 and 2 described above and modifications thereof are applicable to multiplexers, radio-frequency front-end circuits, and other suitable devices.

In the present preferred embodiment, such a radio-frequency front-end circuit will be described.

Figure 15:
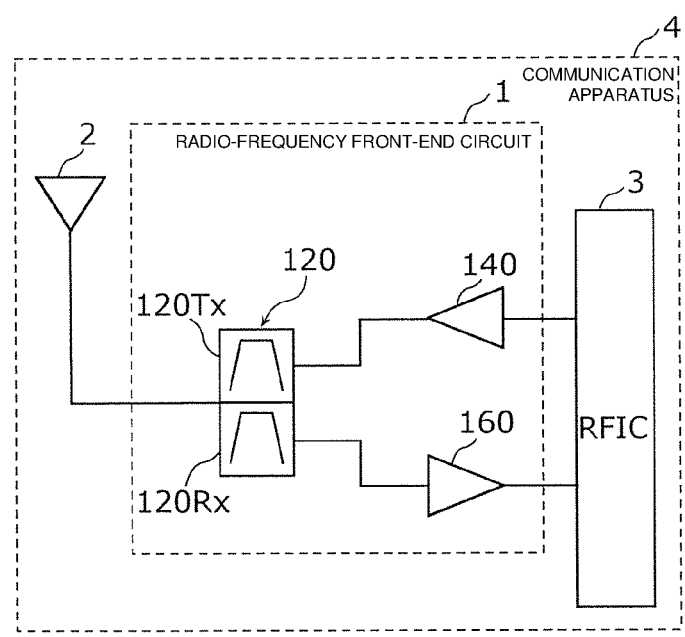
FIG. 15 is a configuration diagram of a radio-frequency front-end circuit according to a Preferred Embodiment 3 of the present invention and its peripheral circuit.

FIG. 15 is a configuration diagram of a radio-frequency front-end circuit 1 according to a Preferred Embodiment 3 of the present invention and its peripheral circuit. In FIG. 15, the radio-frequency front-end circuit 1, an antenna element 2, and an RF signal processing circuit (RFIC) 3 are illustrated. The radio-frequency front-end circuit 1 and the RFIC 3 define a communication apparatus 4. The antenna element 2, the radio-frequency front-end circuit 1, and the RFIC 3 are provided in a front-end portion of a multi-mode/multi-band cellular phone, for example.

The antenna element 2 is preferably, for example, a multi-band antenna complying with a communication standard such as LTE and configured to transmit and receive radio-frequency signals. For example, the antenna element 2 may not support all of the bands of the communication apparatus 4, and may support only bands in a low-frequency band group or a high-frequency band group. Further, the antenna element 2 may not be included in the communication apparatus 4, but may be provided separately from the communication apparatus 4.

The radio-frequency front-end circuit 1 transmits a radio-frequency signal between the antenna element 2 and the RFIC 3. Specifically, the radio-frequency front-end circuit 1 transmits a radio-frequency signal (here, a radio frequency transmission signal) output from the RFIC 3 to the antenna element via a transmission-side signal path. Further, the radio-frequency front-end circuit 1 transmits a radio-frequency signal (here, a radio frequency reception signal) received by the antenna element 2 to the RFIC 3 via a reception-side signal path.

The radio-frequency front-end circuit 1 includes a duplexer 120, a transmission amplifier circuit 140, and a reception amplifier circuit 160.

The duplexer 120 is preferably a multiplexer including a transmission-side filter 120Tx and a reception-side filter 120Rx, at least one of which is provided with an acoustic wave filter device described above. Each of the transmission-side filter 120Tx and the reception-side filter 120Rx includes an antenna-side input/output terminal connected to the antenna element 2, and another terminal connected to the transmission amplifier circuit 140 or the reception amplifier circuit 160.

The transmission amplifier circuit 140 is a power amplifier that amplifies the power of a radio frequency transmission signal output from the RFIC 3.

The reception amplifier circuit 160 is a low-noise amplifier that amplifies the power of a radio frequency reception signal received by the antenna element 2.

The RFIC 3 is an RF signal processing circuit that processes a radio-frequency signal transmitted or received by the antenna element 2. Specifically, the RFIC 3 performs signal processing on a radio-frequency signal (here, a radio frequency reception signal) input from the antenna element 2 via the reception-side signal path of the radio-frequency front-end circuit 1 using down-conversion, for example, to generate a reception signal, and outputs the reception signal to a baseband signal processing circuit (not illustrated). Further, the RFIC 3 performs signal processing on a transmission signal input from the baseband signal processing circuit using up-conversion, for example, to generate a radio-frequency signal (here, a radio frequency transmission signal), and outputs the radio-frequency signal to the transmission-side signal path of the radio-frequency front-end circuit 1.

The radio-frequency front-end circuit 1 having the configuration described above includes an acoustic wave filter device described above, and thus is able to achieve both low loss and high selectivity (prevention of mutual interference with other bands adjacent to its own band) and is able to be reduced in size. This configuration is suitable for use in, in particular, the radio-frequency front-end circuit 1, which is applied to the communication apparatus 4 supporting multiple bands.

The filters (acoustic wave filter devices) provided in the Preferred Embodiments 1 and 2 described above and modifications thereof are also applicable to a radio-frequency front-end circuit supporting a system that uses more bands than the radio-frequency front-end circuit 1 according to the Preferred Embodiment 3. In this modification, such a radio-frequency front-end circuit will be described.

Figure 16:
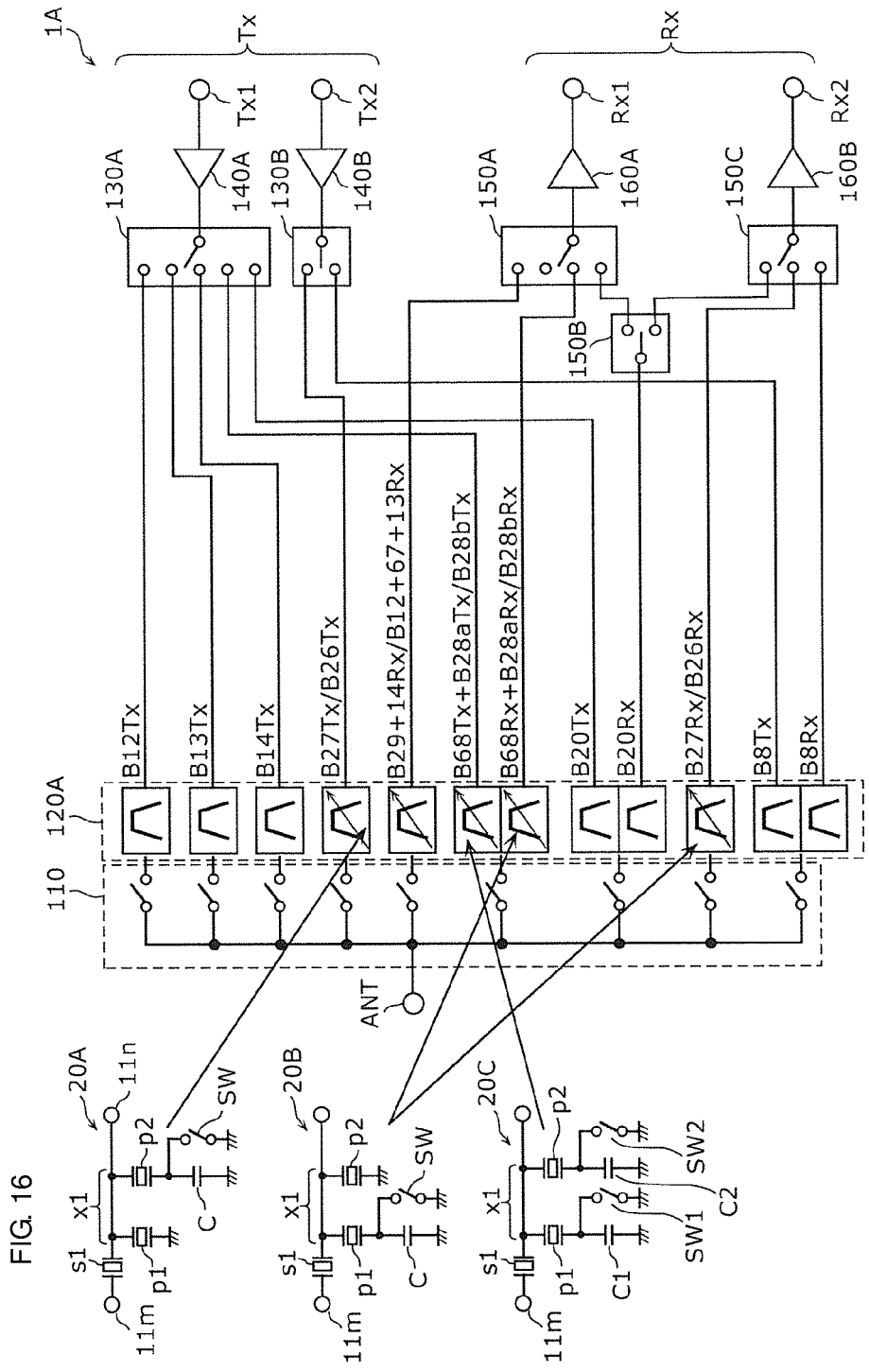
FIG. 16 is a configuration diagram of a radio-frequency front-end circuit according to a modification of the Preferred Embodiment 3 of the present invention.

FIG. 16 is a configuration diagram of a radio-frequency front-end circuit 1A according to a modification of the Preferred Embodiment 3.

As illustrated in FIG. 16, the radio-frequency front-end circuit 1A includes an antenna terminal ANT, transmission terminals Tx1 and Tx2, and reception terminals Rx1 and Rx2. The radio-frequency front-end circuit 1A further includes, in sequence from the antenna terminal ANT side, a switch group 110 including a plurality of switches, a filter group 120A including a plurality of filters, transmission-side switches 130A and 130B, reception-side switches 150A, 150B, and 150C, transmission amplifier circuits 140A and 140B, and reception amplifier circuits 160A and 160B.

The switch group 110 connects the antenna terminal ANT and a signal path supporting a predetermined band in accordance with a control signal from the controller (not illustrated). The switch group 110 preferably includes, for example, a plurality of SPST switches. The number of signal paths to be connected to the antenna terminal ANT is not limited to one, and a plurality of signal paths may be connected to the antenna terminal ANT. That is, the radio-frequency front-end circuit 1A may support carrier aggregation.

The filter group 120A preferably includes, for example, a plurality of filters (including a duplexer) having the following bands as a pass band. Specifically, the bands are: (i) the transmission band of Band 12, (ii) the transmission band of Band 13, (iii) the transmission band of Band 14, (iv) the transmission band of Band 27 (or Band 26), (v) the reception bands of Band 29 and Band 14 (or Band 12, Band 67, and Band 13), (vi-Tx) the transmission bands of Band 68 and Band 28a (or Band 68 and Band 28b), (vi-Rx) the reception bands of Band 68 and Band 28a (or Band 68 and Band 28b), (vii-Tx) the transmission band of Band 20, (vii-Rx) the reception band of Band 20, (viii) the reception band of Band 27 (or Band 26), (ix-Tx) the transmission band of Band 8, and (ix-Rx) the reception band of Band 8.

The transmission-side switch 130A includes a plurality of selection terminals connected to a plurality of low-band transmission-side signal paths, and a common terminal connected to the transmission amplifier circuit 140A. The transmission-side switch 130B includes a plurality of selection terminals connected to a plurality of high-band transmission-side signal paths, and a common terminal connected to the transmission amplifier circuit 140B. The transmission-side switches 130A and 130B are disposed in the preceding stage of the filter group 120A (here, in the preceding stage in the transmission-side signal path) and are each configured such that the connection state is switched in accordance with a control signal from the controller (not illustrated). Accordingly, radio-frequency signals (here, radio frequency transmission signals) amplified by the transmission amplifier circuits 140A and 140B are output from the antenna terminal ANT to the antenna element 2 (see FIG. 15) via predetermined filters in the filter group 120A.

The reception-side switch 150A includes a plurality of selection terminals connected to a plurality of low-band reception-side signal paths, and a common terminal connected to the reception amplifier circuit 160A. The reception-side switch 150B includes a common terminal connected to a reception-side signal path for a predetermined band (here, Band 20), and two selection terminals connected to the selection terminal of the reception-side switch 150A and the selection terminal of the reception-side switch 150C.

The reception-side switch 150C includes a plurality of selection terminals connected to a plurality of high-band reception-side signal paths, and a common terminal connected to the reception amplifier circuit 160B. The reception-side switches 150A to 150C are disposed in the subsequent stage of the filter group 120A (here, in the subsequent stage in the reception-side signal path) and are each configured such that the connection state is switched in accordance with a control signal from the controller (not illustrated). Accordingly, radio-frequency signals (here, radio frequency reception signals) input to the antenna terminal ANT are amplified by the reception amplifier circuits 160A and 160B via predetermined filters in the filter group 120A and are output from the reception terminals Rx1 and Rx2 to the RFIC 3 (see FIG. 15). An RFIC supporting low bands and an RFIC supporting high bands may be separately disposed.

The transmission amplifier circuit 140A is a power amplifier that amplifies the power of a low-band radio frequency transmission signal, and the transmission amplifier circuit 140B is a power amplifier that amplifies the power of a high-band radio frequency transmission signal.

The reception amplifier circuit 160A is a low-noise amplifier that amplifies the power of a low-band radio frequency reception signal, and the reception amplifier circuit 160B is a low-noise amplifier that amplifies the power of a high-band radio frequency reception signal.

The radio-frequency front-end circuit 1A having the configuration described above preferably includes the filter 20A according to the Application Example 1 of the Preferred Embodiment 2 as a filter having (iv) the transmission band of Band 27 (or Band 26) as a pass band. That is, this filter switches the pass band between the transmission band of Band 27 and the transmission band of Band 26 in accordance with a control signal.

Further, the radio-frequency front-end circuit 1A preferably includes the filter 20B according to the Application Example 2 of the Preferred Embodiment 2 as a reception filter having (vi-Rx) the reception bands of Band 68 and Band 28a (or Band 68 and Band 28b) as a pass band, and preferably further includes the filter 20C according to the Application Example 3 of the Preferred Embodiment 2 as a transmission filter having (vi-Tx) the transmission bands of Band 68 and Band 28a (or Band 68 and Band 28b) as a pass band. That is, a duplexer defined by the transmission filter and the reception filter switches the pass band between the transmission bands of Band 68 and Band 28a and the transmission bands of Band 68 and Band 28b and switches the pass band between the reception bands of Band 68 and Band 28a and the reception bands of Band 68 and Band 28b in accordance with a control signal.

Further, the radio-frequency front-end circuit 1A preferably includes the filter 20B according to the Application Example 2 of the Preferred Embodiment 2 as a filter having (viii) the reception band of Band 27 (or Band 26) as a pass band. That is, this filter switches the pass band between the reception band of Band 27 and the reception band of Band 26 in accordance with a control signal.

The radio-frequency front-end circuit 1A having the configuration described above includes the filters 20A to 20C (acoustic wave filter devices) according to the Application Examples 1 to 3 of the Preferred Embodiment 2 described above, which reduces the number of filters, compared with when a filter is disposed for each band, and is thus able to be reduced in size.

Furthermore, the radio-frequency front-end circuit 1A according to the present preferred embodiment includes the transmission-side switches 130A and 130B and the reception-side switches 150A to 150C (switch circuits) in the preceding stage or subsequent stage of the filter group 120A (a plurality of acoustic wave filter devices). This configuration enables some of signal paths along which radio-frequency signals are transmitted to be shared. Thus, for example, the transmission amplifier circuits 140A and 140B or the reception amplifier circuits 160A and 160B (amplifier circuits) corresponding to a plurality of acoustic wave filter devices are able to be shared. Accordingly, the size and cost of the radio-frequency front-end circuit 1A are able to be reduced.

At least one of the transmission-side switches 130A and 130B and at least one of the reception-side switches 150A to 150C may be provided. The number of transmission-side switches 130A and 130B and the number of reception-side switches 150A to 150C are not limited to those described above, and, for example, a single transmission-side switch and a single reception-side switch may be provided. In addition, the number of selection terminals of a transmission-side switch and a reception-side switch is not limited to that in the present preferred embodiment, and a transmission-side switch and a reception-side switch may each include two selection terminals.

Alternatively, the configurations of the filters according to the Preferred Embodiment 1 and modification thereof may be applied to at least one filter among a plurality of filters included in a filter group.

While acoustic wave filter devices and radio-frequency front-end circuits according to preferred embodiments of the present invention have been described with reference to the Preferred Embodiments 1 to 3 and modifications thereof, the present invention is not limited to the preferred embodiments and modifications described above. Any of the elements in the preferred embodiments and modifications described above may be combined to provide other preferred embodiments, or various modifications conceived of by a person skilled in the art without departing from the gist of the present invention may be made to the preferred embodiments. Such preferred embodiments and modifications and various devices including acoustic wave filter devices and radio-frequency front-end circuits according to preferred embodiments of the present invention are also included in the present invention.

For example, in the preferred embodiments described above, the parallel-arm resonator p1 includes reflectors. However, the parallel-arm resonator p1 may not include a reflector. Note that when the parallel-arm resonator p1 includes reflectors, the Q at the anti-resonant frequency is able to be designed to have a high value, which reduces the loss within the pass band and improves the sharpness on the high-frequency side of the pass band.

Furthermore, in the preferred embodiments described above, for example, the parallel-arm resonator p2 does not include a reflector, but this is not limiting. The parallel-arm resonator p2 may include reflectors. In terms of a reduction in the size of an acoustic wave filter, it is preferable that the number of electrode fingers of reflectors included in the parallel-arm resonator p2 is smaller than the number of electrode fingers of the reflectors 122 included in the parallel-arm resonator p1.

Figure 17:
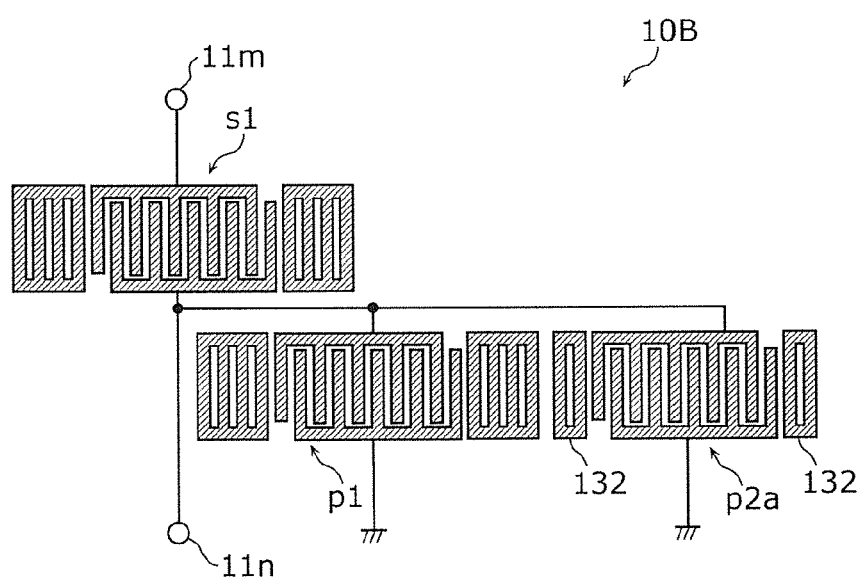
FIG. 17 is a schematic plan view of an electrode structure of a filter according to another preferred embodiment of the present invention.

FIG. 17 is a schematic plan view of an electrode structure of a filter 10B having the configuration described above. The resonant frequency of a parallel-arm resonator p2a (second parallel-arm resonator) is higher than the resonant frequency of the parallel-arm resonator p1 (first parallel-arm resonator), and the anti-resonant frequency of the parallel-arm resonator p2a is higher than the anti-resonant frequency of the parallel-arm resonator p1. Further, each of the parallel-arm resonator p1 and the parallel-arm resonator p2a includes an IDT electrode that excites an acoustic wave, and reflectors that reflect the acoustic wave excited by the IDT electrode. Reflectors 132 of the parallel-arm resonator p2a include fewer electrode fingers than reflectors of the parallel-arm resonator p1. In FIG. 17, for example, the reflectors of the parallel-arm resonator p1 each include four electrode fingers, and the reflectors 132 of the parallel-arm resonator p2a each include two electrode fingers, and the configuration of the parallel-arm resonator p2a, which includes the reflectors 132 with fewer electrode fingers than the reflectors of the parallel-arm resonator p1, is schematically illustrated.

As illustrated in part (b) of FIG. 4, it is discovered that the fewer the electrode fingers of a reflector, the lower the Q (Qa) at the anti-resonant frequency. In contrast, it is discovered that the fewer the electrode fingers of a reflector, the lower the Q (Qr) at the resonant frequency, with the amount of decrease in Q (Qr) at the resonant frequency being smaller. However, the parallel-arm resonator p2 including no reflector has lower Q at the resonant frequency, with the amount of decrease in Q at the resonant frequency being smaller than that for when the parallel-arm resonator p2 includes reflectors.

Accordingly, as in the filter 10B, the reflectors 132 of the parallel-arm resonator p2a include fewer electrode fingers, thus reducing the size of the acoustic wave filter device while further reducing or preventing the increase in loss within the pass band and the deterioration of the sharpness on the high-frequency side of the pass band.

Further, as illustrated in FIG. 17, a series-arm resonant circuit (here, the series-arm resonator s1) includes one or more IDT electrodes (here, one IDT electrode) that excites an acoustic wave, and reflectors that reflect the acoustic wave excited by the one or more IDT electrodes, and the reflectors of the series-arm resonator s1 include more electrode fingers than reflectors of the parallel-arm resonator p2a (second parallel-arm resonator). The pass band and the attenuation band of a filter is defined by the resonant frequency and anti-resonant frequency of the series-arm resonator s1. For the impedance characteristic of a resonator alone, there is a large difference in Q at the anti-resonant frequency and there is also a difference in Q at the resonant frequency between when a reflector included in the resonator includes many electrode fingers and when it includes a few electrode fingers. Accordingly, more electrode fingers are included in the reflectors of the series-arm resonator s1, thus enabling an increase in the Qs at the resonant frequency and anti-resonant frequency of the series-arm resonator and enabling further reduction or prevention of the increase in loss within the pass band and the deterioration of the sharpness on the high-frequency side of the pass band.

Furthermore, for example, the communication apparatus 4 including a radio-frequency front-end circuit described above and the RFIC 3 (RF signal processing circuit) is also included in preferred embodiments of the present invention. The communication apparatus 4 having the configuration described above is able to achieve low loss and high selectivity.

Furthermore, the IDT electrodes included in the series-arm resonator s1 and the parallel-arm resonators p1 and p2 may have the same or different aspect ratios. However, in terms of improved filter characteristics, the IDT electrode 131 included in the parallel-arm resonator p2 preferably has a lower aspect ratio than the IDT electrode 121 included in the parallel-arm resonator p1.

Furthermore, the IDT electrodes included in the series-arm resonator s1 and the parallel-arm resonators p1 and p2 may have the same or different duty ratios. However, in terms of improved filter characteristics, the duty ratio of the IDT electrode 131 included in the parallel-arm resonator p2 is preferably higher than the duty ratio of the IDT electrode 121 included in the parallel-arm resonator p1.

Furthermore, the series-arm resonator s1 is not limited to an acoustic wave resonator that uses a surface acoustic wave, and may include, for example, an acoustic wave resonator that uses a bulk wave or a boundary acoustic wave. That is, the series-arm resonator s1 may not include an IDT electrode. Even an acoustic wave filter device including the series-arm resonator s1 having this configuration is able to achieve both low loss and high selectivity (prevention of mutual interference with other bands adjacent to its own band) since an acoustic wave resonator generally exhibits a high-Q characteristic.

Furthermore, for example, in a radio-frequency front-end circuit or a communication apparatus, an inductor or a capacitor may be connected between individual components. The inductor may include a wiring inductor using wiring that connects individual components.

Preferred embodiments of the present invention provide compact filters, multiplexers, front-end circuits, and communication apparatuses applicable to a multi-band system, which may be widely used in communication devices, such as cellular phones, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave filter device comprising:
a series-arm resonant circuit connected on a path connecting a first input/output terminal and a second input/output terminal; and
a first parallel-arm resonator and a second parallel-arm resonator connected between a same node on the path and ground; wherein
a resonant frequency of the second parallel-arm resonator is higher than a resonant frequency of the first parallel-arm resonator;
an anti-resonant frequency of the second parallel-arm resonator is higher than an anti-resonant frequency of the first parallel-arm resonator;
the second parallel-arm resonator includes an IDT electrode that excites an acoustic wave, and does not include a reflector; and
the first parallel-arm resonator includes an IDT electrode that excites an acoustic wave, and a reflector that reflects the acoustic wave excited by the IDT electrode.

2. The acoustic wave filter device according to claim 1, wherein the first parallel-arm resonator and the second parallel-arm resonator are connected in parallel.

3. The acoustic wave filter device according to claim 2, further comprising an impedance element and a switch element that are connected in parallel to each other and that are connected in series with at least one of the first parallel-arm resonator and the second parallel-arm resonator.

4. The acoustic wave filter device according to claim 3, wherein the impedance element and the switch element that are connected in parallel to each other are connected in series with only the second parallel-arm resonator of the first and second parallel-arm resonators.

5. The acoustic wave filter device according to claim 3, wherein the impedance element and the switch element that are connected in parallel to each other are connected in series with only the first parallel-arm resonator of the first and second parallel-arm resonators.

6. The acoustic wave filter device according to claim 1, wherein
the first parallel-arm resonator and the second parallel-arm resonator are connected in series.

7. The acoustic wave filter device according to claim 6, further comprising
a switch element connected in parallel to one of the first parallel-arm resonator and the second parallel-arm resonator.

8. A communication apparatus comprising:
an RF signal processing circuit that processes a radio-frequency signal transmitted or received by an antenna element; and
the radio-frequency front-end circuit according to claim 6 that transmits the radio-frequency signal between the antenna element and the RF signal processing circuit.

9. The acoustic wave filter device according to claim 1, wherein
the series-arm resonant circuit is a series-arm resonator including one or more acoustic wave resonators, and
the series-arm resonant circuit, the first parallel-arm resonator, and the second parallel-arm resonator form a ladder filter structure.

10. The acoustic wave filter device according to claim 1, wherein
the series-arm resonant circuit includes a longitudinally coupled resonator including a plurality of acoustic wave resonators.

11. A radio-frequency front-end circuit comprising:
the acoustic wave filter device according to claim 1; and
an amplifier circuit connected to the acoustic wave filter device.

12. An acoustic wave filter device comprising:
a series-arm resonant circuit including one or more acoustic wave resonators connected between a first input/output terminal and a second input/output terminal; and
a first parallel-arm resonator and a second parallel-arm resonator connected between a same node on a path connecting the first input/output terminal and the second input/output terminal and ground; wherein
a resonant frequency of the second parallel-arm resonator is higher than a resonant frequency of the first parallel-arm resonator;
an anti-resonant frequency of the second parallel-arm resonator is higher than an anti-resonant frequency of the first parallel-arm resonator;
each of the first parallel-arm resonator and the second parallel-arm resonator includes:
an IDT electrode that excites an acoustic wave; and
a reflector that reflects the acoustic wave excited by the IDT electrode; and
the reflector in the second parallel-arm resonator includes fewer electrode fingers than the reflector in any resonator included in the acoustic filter device.

13. The acoustic wave filter device according to claim 12, wherein
the series-arm resonant circuit includes:
one or more IDT electrodes that excite an acoustic wave; and
a reflector that reflects the acoustic wave excited by the one or more IDT electrodes; and
the reflector in the second parallel-arm resonator includes fewer electrode fingers than the reflector in the series-arm resonant circuit.

14. The acoustic wave filter device according to claim 12, wherein the first parallel-arm resonator and the second parallel-arm resonator are connected in parallel.

15. The acoustic wave filter device according to claim 14, further comprising an impedance element and a switch element that are connected in parallel to each other, and that are connected in series with at least one of the first parallel-arm resonator and the second parallel-arm resonator.

16. The acoustic wave filter device according to claim 15, wherein the impedance element and the switch element that are connected in parallel to each other are connected in series with only the second parallel-arm resonator of the first and second parallel-arm resonators.

17. The acoustic wave filter device according to claim 15, wherein the impedance element and the switch element that are connected in parallel to each other are connected in series with only the first parallel-arm resonator of the first and second parallel-arm resonators.

18. The acoustic wave filter device according to claim 15, wherein the impedance element and the switch element that are connected in parallel to each other are connected in series with a circuit including the first parallel-arm resonator and the second parallel-arm resonator are connected in parallel.

19. The acoustic wave filter device according to claim 14, further comprising:
an impedance element and a switch element that are connected in parallel to each other and that are connected in series with only the first parallel-arm resonator of the first and second parallel-arm resonators; and
another impedance element and another switch element that are connected in parallel to each other and that are connected in series with only the first parallel-arm resonator out of the first parallel-arm resonator and the second parallel-arm resonator.

* * * * *